US009307637B2

(12) United States Patent
Takahashi et al.

(10) Patent No.: US 9,307,637 B2
(45) Date of Patent: Apr. 5, 2016

(54) METALLIZED VIA-HOLED CERAMIC SUBSTRATE, AND METHOD FOR MANUFACTURE THEREOF

(71) Applicant: TOKUYAMA CORPORATION, Shunan-shi, Yamaguchi (JP)

(72) Inventors: Naoto Takahashi, Yamaguchi (JP); Yasuyuki Yamamoto, Yamaguchi (JP)

(73) Assignee: TOKUYAMA CORPORATION, Shunan-shi, Yamaguchi (JP)

( * ) Notice: Subject to any disclaimer, the term of this patent is extended or adjusted under 35 U.S.C. 154(b) by 588 days.

(21) Appl. No.: 13/710,805

(22) Filed: Dec. 11, 2012

(65) Prior Publication Data

US 2013/0186675 A1    Jul. 25, 2013

(30) Foreign Application Priority Data

Jan. 25, 2012  (JP) ................................. 2012-013008

(51) Int. Cl.

| H05K 1/11 | (2006.01) |
|---|---|
| H05K 1/03 | (2006.01) |
| H05K 3/00 | (2006.01) |
| H01L 23/498 | (2006.01) |
| H01L 23/15 | (2006.01) |
| H05K 1/09 | (2006.01) |
| H01L 33/62 | (2010.01) |
| H05K 3/24 | (2006.01) |
| H05K 3/40 | (2006.01) |

(52) U.S. Cl.
CPC .............. *H05K 1/0306* (2013.01); *H01L 23/15* (2013.01); *H01L 23/49827* (2013.01); *H05K 3/0094* (2013.01); *H05K 3/246* (2013.01); *H01L 33/62* (2013.01); *H01L 2924/0002* (2013.01); *H05K 1/092* (2013.01); *H05K 1/113* (2013.01); *H05K 3/245* (2013.01); *H05K 3/4061* (2013.01); *H05K 2203/1476* (2013.01)

(58) Field of Classification Search
USPC ......... 174/262, 250, 255, 257, 258, 260, 263, 174/264; 361/306.3, 321.2, 321.5, 748; 257/702, 777
See application file for complete search history.

(56) References Cited

U.S. PATENT DOCUMENTS

2004/0035693 A1    2/2004  Ru
2006/0261364 A1*   11/2006  Suehiro et al. ................ 257/100

FOREIGN PATENT DOCUMENTS

JP          11340600 A    12/1999

* cited by examiner

*Primary Examiner* — Tremesha S Willis
(74) *Attorney, Agent, or Firm* — Ladas & Parry LLP

(57) ABSTRACT

The present invention provides a metallized via-holed ceramic substrate having (1) a sintered ceramic substrate, (2) an electroconductive via formed in the sintered ceramic substrate, having an electroconductive metal closely filled in a through-hole of the sintered ceramic substrate, wherein the electroconductive metal contains a metal (A) with melting point of 600° C. to 1100° C., a metal (B) with higher melting point than the metal (A), and an active metal, (3) a wiring pattern on at least one face of the sintered ceramics substrate, having an electroconductive surface layer and a plating layer thereon, wherein the electroconductive surface layer consists of an electroconductive metal containing the metal (A), the metal (B), and an active metal, (4) an active layer formed in the interface between the electroconductive via and the sintered ceramic substrate, and (5) an active layer formed in the interface between the electroconductive surface layer and the sintered ceramic substrate.

16 Claims, 5 Drawing Sheets

METALLIZED VIA-HOLED CERAMIC SUBSTRATE, AND METHOD FOR MANUFACTURE THEREOF

TECHNICAL FIELD

The present invention relates to a metallized via-holed ceramic substrate and a method for manufacturing the same. Specifically, it relates to a metallized via-holed ceramic substrate and the like favorably used to mount a semiconductor device such as an LED, and particularly to mount a semiconductor device such as a high-output LED which releases heat.

BACKGROUND ART

A ceramic substrate for mounting a semiconductor device has a metallized pattern to connect with an electrode of the semiconductor device, formed on a face(s) of the ceramic substrate. Further, if the ceramic substrate is used for example as a multilayer substrate or a submount, an electroconductive via for conduction between upper and lower portions of the substrate is formed on the ceramic substrate (hereinafter, the ceramic substrate having the electroconductive via and the metallized pattern is sometimes referred to as a "metallized via-holed ceramic substrate").

As a method for manufacturing the metallized via-holed ceramic substrate, a co-firing method (simultaneous firing method) and a post-firing method (sequential firing method) are known. In the co-firing method, a metal paste layer is formed on an unfired ceramic substrate precursor called a green sheet, or a metal paste is filled into a through-hole formed in the green sheet, to thereby prepare and fire a metallized via-holed ceramic substrate precursor. In this method, the green sheet and the metal paste are fired simultaneously.

In the post-firing method, a metal paste layer is formed on a sintered substrate obtained by firing a green sheet, or a metal paste is filled into a through-hole formed in the sintered substrate, to thereby prepare and fire a metallized via-holed ceramic substrate precursor. In this method, the green sheet and the metal paste layer are fired sequentially.

Both methods enable formation of the metallized pattern on the ceramic substrate, and the substrate obtained by the methods is mainly used as a substrate for mounting an electronic component. In the co-firing method, however, the green sheet tends to shrink unevenly when fired. If a square green sheet is sintered for example, a central portion on each side thereof shrinks slightly to warp inward, and the substrate deforms into a star shape. Therefore, when many metallized patterns having the same shape and electroconductive vias are formed on one green sheet, the shape of the patterns and the position of the vias inevitably change slightly depending on the location of the patterns. Moreover, in the co-firing method, the metal paste and the green sheet are simultaneously fired at high temperature, and thus, the method has such disadvantages that it requires use of a high-melting-point metal paste of molybdenum, tungsten etc., as the metal paste, and does not allow use of other metals excellent in electroconductivity.

On the other hand, in the post-firing method, the metal paste layer is formed on the sintered substrate, or the metal paste is filled into the through-hole formed in the sintered substrate, and then fired to thereby form the metallized pattern and the electroconductive via. In printing (firing) the metal paste layer, the metal paste layer shrinks in its thickness direction, but hardly shrinks in its planar direction. Thus, there is not a problem that the shape of the pattern changes depending on its location, as is seen in the co-firing method.

However, since the metal paste itself does shrink, shrinkage of the metal paste in the through-hole occurs upon sintering, causing voids in the formed electroconductive via, and making it difficult to form a dense via.

Patent document 1 discloses a method comprising forming, by sputtering, a titanium layer and a copper layer on a ceramic substrate having a through-hole, and thereafter performing copper electroplating, to thereby form a wiring pattern and an electroconductive via. Since the method requires the sputtering step and thus necessitates a manufacturing facility for the sputtering, it does not allow simple manufacturing of the metallized via-holed substrate. Moreover, in filling copper into the through-hole by electroplating in this method, if the diameter of the through-hole or the thickness of the substrate is large, more time will be needed for the filling, causing degradation in the productivity. Additionally, as the filling requires longer time, the thickness of the wiring pattern formed simultaneously and the layer thickness of the resist pattern needed increase, thus making it difficult to attain high precision of the pattern.

When it is desired to reduce the thickness of the wiring pattern in order to form a fine pattern, copper may be deposited thinly only on faces of the through-hole without filling the through-hole completely by electroplating. Thereby as well, the conduction between wirings on both faces of the substrate can be ensured. However, when the substrate is used for example for mounting an LED device and the like, there occur such problems as leakage of a mold resin to the opposite face through the through-hole at a time of forming a lens for the LED device; and rising of a solder to the wiring on the opposite face via the plated face of the through-hole at the time of mounting. These circumstances can be prevented by filling a hole-filling resin paste and the like into the through-hole. However, this causes problems that not only the manufacturing process becomes complicated but also the conductivity of the via degrades.

CITATION LIST

Patent Documents

Patent document 1: US Patent Application Publication No. 2004/00359693

SUMMARY OF THE INVENTION

Problems to be Solved by the Invention

Accordingly, an object of the present invention is to provide: a metallized via-holed ceramic substrate which can be manufactured in a simple method and can have a highly precise wiring pattern; and a method for manufacturing the same.

Means for Solving the Problems

Hereinafter, the present invention will be descried. It should be noted that in the specification, "A to B" regarding numerical values A and B means "A or more and B or less", unless otherwise specified. In cases where the unit of the numerical value A is omitted in the description, the unit given to the numerical value B is applied as the unit of the numerical value A. Moreover, in the specification, an average particle diameter is a sphere equivalent diameter (volume average D50) which gives the median of a volume distribution measured by laser diffractometry using Microtrack manufactured by Nikkiso Co., Ltd.

A first aspect of the present invention is a metallized via-holed ceramic substrate including: a sintered ceramic substrate; an electroconductive via formed in the sintered ceramic substrate, the electroconductive via having an electroconductive metal closely filled in a through-hole of the sintered ceramic substrate, the electroconductive metal containing a metal (A) having a melting point of 600° C. to 1100° C., a metal (B) having a melting point higher than the melting point of the metal (A), and an active metal; a wiring pattern on at least one face of the sintered ceramic substrate, the wiring pattern having an electroconductive surface layer and a plating layer on a surface of the electroconductive surface layer, the electroconductive surface layer consisting of an electroconductive metal containing the metal (A), the metal (B), and an active metal; an active layer formed in the interface between the electroconductive via and the sintered ceramic substrate; and an active layer formed in the interface between the electroconductive surface layer and the sintered ceramic substrate. Hereinafter, the electroconductive via is sometimes simply referred to as a via.

The "metal (B) having a melting point higher than the melting point of the metal (A)" does not necessarily mean a metal having a melting point of over 1100° C., but means a metal having a melting point higher than the melting point of the metal (A) actually used. For example, if the metal (A) is silver solder having a melting point of about 780° C., a metal having a melting point higher than the melting point of this metal (A), that is, copper (melting point: 1085° C.), silver (melting point: 962° C.), gold (melting point: 1064° C.), and the like can be employed as the metal (B).

Examples of the "metal (A) having a melting point of 600° C. to 1100° C." may be copper, silver, gold, and solder materials such as gold solder and silver solder. In addition, examples of the "metal (B) having a melting point higher than the melting point of the metal (A)" include copper (melting point: 1085° C.), silver (melting point: 962° C.), gold (melting point: 1064° C.), tungsten (melting point: 3410° C.), and molybdenum (melting point: 2617° C.); and the metal (B) is selected based on the melting point of the metal (A) to be used.

In the first aspect of the present invention, the "metal (A) having a melting point of 600° C. to 1100° C." is preferably one or more selected from a group consisting of gold solder, silver solder, and copper.

In the first aspect of the present invention, the "metal (B) having a melting point higher than the melting point of the metal (A)" is preferably one or more selected from a group consisting of silver, copper, and gold.

In the first aspect of the present invention, each "active layer" is preferably a reaction layer formed by a reaction of the active metal with a ceramic component of the sintered ceramic substrate. In this configuration, more preferably, the active metals are titanium, the ceramic component to react with the titanium is nitrogen, and the active layers are titanium nitride layers. The formation of the active layer provides good adhesion between the via and a wall face of the sintered ceramic substrate.

In the first aspect of the present invention, the sintered ceramic substrate is preferably a sintered aluminum nitride substrate. The via-holed ceramic substrate of the first aspect of the present invention has a via with good electroconductivity and is suitable for mounting a device which requires high power supply, such as a high-output LED. The device such as the high-output LED releases a large amount of heat. Since the heat accumulated near the device has a negative effect on the device, the heat is preferably released to the outside. In this viewpoint, the sintered ceramic substrate is preferably made of aluminum nitride having high thermal conductivity.

In the first aspect of the present invention, the wiring pattern has an electroconductive surface layer and a plating layer on a surface of the electroconductive surface layer. The plating layer may comprise a plating layer of multiple layers. With the plating layer included in the wiring pattern, the conductivity of the wiring pattern can be improved. In this configuration, the above plating layer more preferably comprises a copper plating layer. With the copper plating layer included in the above plating layer of the wiring pattern, the conductivity of the wiring pattern can be improved more easily.

In the first aspect of the present invention, the wiring pattern is preferably a metallized pattern formed by photolithographic method. Forming the pattern by the photolithographic method enables the line-and-space of the metallized pattern to be no more than 50 μm/50 μm.

In the present invention, that the line-and-space of the wiring pattern is "no more than A μm/B μm" means that the line (line width) is no more than A μm, and the space (line space) is no more than B μm. The same shall apply in a case of indicating "no more than A/B μm".

A second aspect of the present invention is a method for manufacturing the metallized via-holed ceramic substrate of the first aspect of the present invention, the method including the steps of:

(i) preparing a sintered ceramic substrate having a through-hole;

(ii) filling a first metal paste into the through-hole, wherein the first metal paste contains a powder of a metal (B) having a melting point higher than a melting point of a metal (A), and an active metal powder;

(iii) applying a second metal paste on at least one face of the sintered ceramic substrate, thereby forming a second metal paste layer where the second metal paste contacts with the first metal paste filled in the through-hole, wherein the second metal paste contains a powder of a metal (B') having a melting point higher than the melting point of the metal (A) and an active metal powder;

(iv) applying a third metal paste on the second metal paste layer, thereby forming a third metal paste layer, wherein the third metal paste contains a powder of the metal (A) having a melting point of 600° C. to 1100° C., and wherein an area where said third metal paste layer is formed overlaps with an area occupied by an opening of the through-hole in contact with the second metal paste layer in contact with formed said third metal paste layer in a penetrative plan view of the sintered ceramic substrate;

(v) firing the substrate obtained via the preceding steps (i) to (iv), thereby forming an electroconductive via in the through-hole, an electroconductive surface layer on the sintered ceramic substrate, an active layer in the interface between the electroconductive via and the sintered ceramic substrate, and an active layer in the interface between the electroconductive surface layer and the sintered ceramic substrate;

(vi) forming a plating layer on the electroconductive surface layer;

(vii) forming a resist pattern on a part of the plating layer to be left as a wiring pattern;

(viii) removing a part of the plating layer and the electroconductive surface layer not covered by the resist pattern, by an etching process;

(ix) removing the resist pattern; and (x) etching an exposed part of the active layer formed in the interface between the electroconductive surface layer and the sintered ceramic substrate.

Herein, the "part of the plating layer and the electroconductive surface layer not covered by the resist pattern" refers to, with respect to the plating layer, a part not in contact with the resist pattern; and with respect to the electroconductive surface layer, it refers to a part to be exposed when the part of the plating layer not in contact with the resist pattern is removed by etching.

The first metal paste containing the powder of the metal (B) and the active metal powder, and the second metal paste containing the powder of the metal (B') and the active metal powder may be the same metal paste. However, the step of filling the metal paste into the through-hole and the step of printing the electroconductive pattern onto the face (s) of the substrate may require different viscosity characteristics of the metal paste, different optimal particle sizes of the metal powder, and so on. Therefore, it is preferable to use metal pastes suitable for the respective manufacturing steps. The same also applies in a below method of a third aspect of the present invention. Preferred configurations of the first metal paste and the second metal paste will be described below respectively.

A third aspect of the present invention is a method for manufacturing the metallized via-holed ceramic substrate of the first aspect of the present invention, the method including the steps of:

(i) preparing a sintered ceramic substrate having a through-hole;

(ii) filling a first metal paste into the through-hole, said first metal paste containing a powder of a metal (B) having a melting point higher than a melting point of a metal (A), and an active metal powder;

(iii) applying a second metal paste on at least one face of the sintered ceramic substrate, thereby forming a second metal paste layer where the second metal paste contacts with the first metal paste filled in the through-hole, wherein said second metal paste contains a powder of a metal (B') having a melting point higher than the melting point of the metal (A) and an active metal powder;

(iv) applying a third metal paste on the second metal paste layer, thereby forming a third metal paste layer, wherein said third metal paste contains a powder of the metal (A) having a melting point of 600° C. to 1100° C., and wherein an area where said third metal paste layer is formed overlaps with an area occupied by an opening of the through-hole in contact with the second metal paste layer in contact with formed said third metal paste layer in a penetrative plan view of the sintered ceramic substrate;

(v) firing the substrate obtained via the preceding steps (i) to (iv), thereby forming an electroconductive via in the through-hole, an electroconductive surface layer on the sintered ceramic substrate, an active layer in the interface between the electroconductive via and the sintered ceramic substrate, and an active layer in the interface between the electroconductive surface layer and the sintered ceramic substrate;

(vi) forming a resist pattern on a part of the electroconductive surface layer where a wiring pattern is not to be formed;

(vii) forming a plating layer on a part of the electroconductive surface layer not covered by the resist pattern;

(viii) removing the resist pattern;

(ix) etching an exposed part of the electroconductive surface layer; and (x) etching an exposed part of the active layer formed in the interface between the electroconductive surface layer and the sintered ceramic substrate.

The manufacturing method of the third aspect of the present invention preferably comprises the step of: (v') forming an anti-oxidation layer on the electroconductive surface layer by copper strike, after the firing step (v).

The manufacturing method of the second and the third aspects of the present invention may further the step of: (v") polishing the surface of the electroconductive surface layer, after the firing step (v).

In the manufacturing method of the second and the third aspects of the present invention, the powder of the metal (B') preferably contains an elemental metal powder of a metal element which is contained in the powder of the metal (A) and has a higher melting point than the melting point of the metal (A). With this configuration of the metal (B'), even when a part of the metal (A) melted is absorbed into the second metal paste layer, it is possible to inhibit composition variation of the electroconductive surface layer. Further in this configuration, preferably, the powder of the metal (A) contains a powder of a silver-copper alloy solder, the powder of the metal (B) contains a copper powder, the powder of the metal (B') contains a copper powder and a silver powder, and each active metal powder is one or more selected from a group consisting of a titanium powder and a titanium hydride powder.

Effects of the Invention

According to the first aspect of the present invention, it is possible to provide a metallized via-holed ceramic substrate which can be manufactured in a simple method and can have a highly precise wiring pattern.

According to the second and third aspects of the present invention, it is possible to provide a method for manufacturing a metallized via-holed ceramic substrate which enables high precision of a wiring pattern in a simple method.

In the method for manufacturing a metallized via-holed ceramic substrate according to the second and the third aspects of the present invention, the electroconductive via has already been formed with the through-hole filled up by the filling and firing of the metal paste, before formation of the plating layer. Therefore, the conductivity of the via is not influenced by the amount of the plating deposition, thus enabling reduction of the thickness of the plating layer formed. Accordingly, the thickness of the resist layer can also be reduced in patterning the wiring pattern. As such, even when it is necessary to form an electroconductive via having a large diameter, a highly precise wiring pattern can be formed.

Additionally, according to the method for manufacturing a metallized via-holed ceramic substrate of the second and the third aspects of the present invention, when the metal (B) in the through-hole and the metal (B') in the second metal paste layer sinter and contract in the firing step, the metal (A) in the third metal paste layer melted flows into voids among the powder particles of the metal (B) in the through-hole and voids among the powder particles of the metal (B') in the second metal paste layer. This results in formation of the electroconductive via and the metallized pattern being dense and having good electroconductivity. Moreover, since the first metal paste and the second metal paste each has the active metal, each active metal reacts with the ceramic component of the sintered ceramic substrate, thereby forming the active layer between the electroconductive via and the sintered ceramic substrate, and the active layer between the metallized pattern and the sintered ceramic substrate. This provides good adhesion between the electroconductive via and the sintered ceramic substrate, and between the metallized pattern and the sintered ceramic substrate.

BRIEF DESCRIPTION OF THE DRAWINGS

FIG. 5 is a view illustrating one configuration in which a third metal paste layer 27 is in a multilayer structure, in the step (2-*d*) of one embodiment of the method for manufacturing a metallized via-holed ceramic substrate related to the second aspect of the present invention.

MODES FOR CARRYING OUT THE INVENTION

Figure 1:
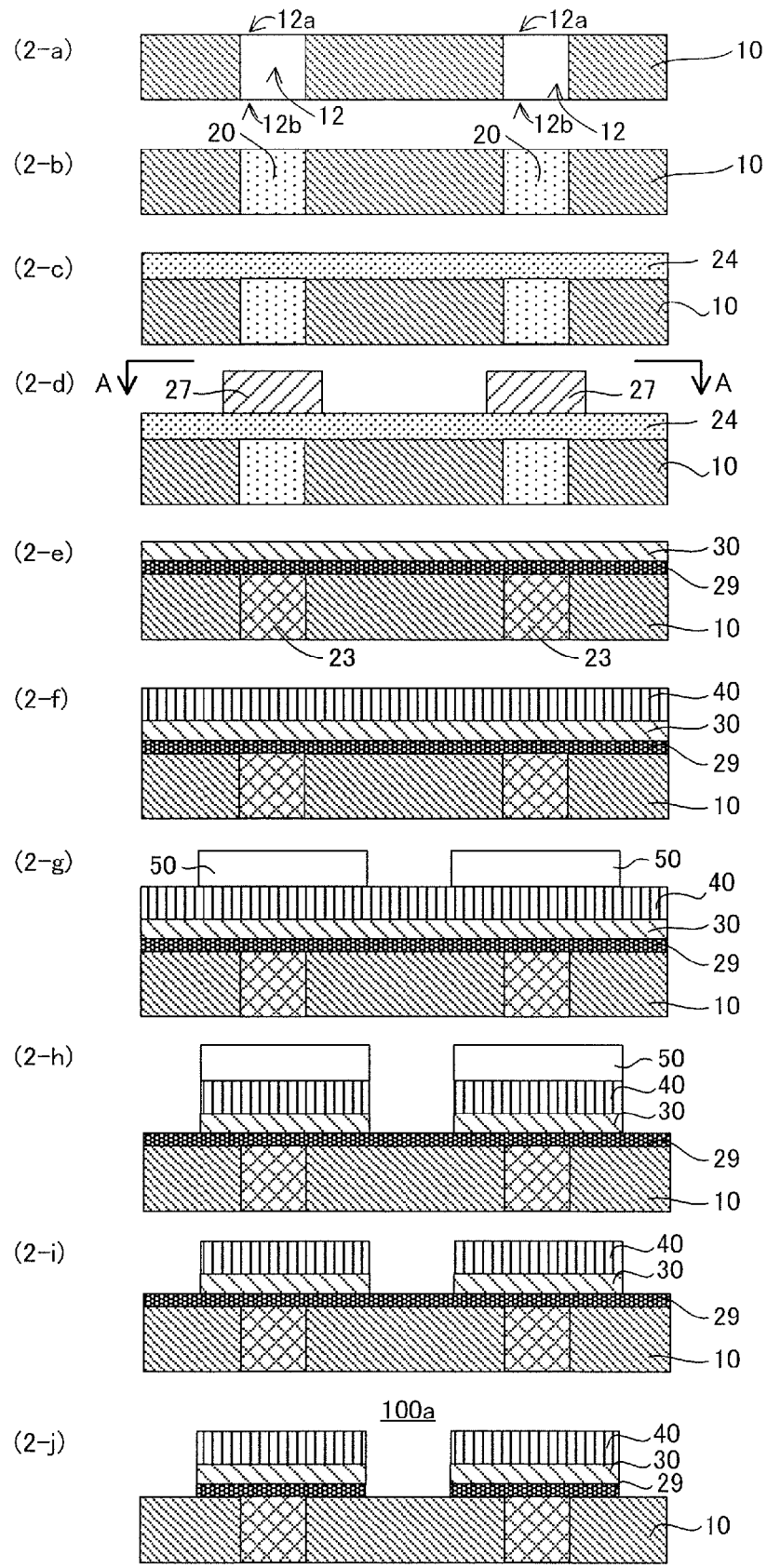
FIG. 1 is a view illustrating one embodiment of the method for manufacturing a metallized via-holed ceramic substrate related to the second aspect of the present invention, with a schematic view of a cross section of the substrate after each step.

The above described functions and benefits of the present invention will be apparent from the modes for carrying out the invention to be described hereinafter. The modes for carrying out the present invention will be described with reference to the drawings. The reference numerals are sometimes omitted. It should be noted that the modes shown below are examples of the present invention, and thus the present invention is not limited to these modes.

<Method for Manufacturing Metallized Via-Holed Ceramic Substrate (Second Aspect of the Present Invention)>

The method for manufacturing the metallized via-holed ceramic substrate of the second aspect of the present invention includes the below steps in the mentioned order:

(2-*a*) preparing a sintered ceramic substrate having a through-hole;

(2-*b*) filling a first metal paste into the through-hole, wherein the first metal paste contains a powder of a metal (B) having a melting point higher than a melting point of a metal (A), and an active metal powder;

(2-*c*) applying a second metal paste on at least one face of the sintered ceramic substrate, thereby forming a second metal paste layer where the second metal paste contacts with the first metal paste filled in the through-hole, wherein the second metal paste contains a powder of a metal (B') having a melting point higher than the melting point of the metal (A) and an active metal powder;

(2-*d*) applying a third metal paste on the second metal paste layer, thereby forming a third metal paste layer, wherein the third metal paste contains a powder of the metal (A);

(2-*e*) firing the substrate obtained via the preceding steps, thereby forming an electroconductive via in the through-hole, an electroconductive surface layer on the sintered ceramic substrate, an active layer in the interface between the electroconductive via and the sintered ceramic substrate, and an active layer in the interface between the electroconductive surface layer and the sintered ceramic substrate;

(2-*f*) forming a plating layer on the electroconductive surface layer;

(2-*g*) forming a resist pattern on a part of the plating layer to be left as a wiring pattern;

(2-*h*) removing a part of the plating layer and the electroconductive surface layer not covered by the resist pattern, by an etching process;

(2-*i*) removing the resist pattern; and (2-*j*) etching an exposed part of the active layer formed in the interface between the electroconductive surface layer and the sintered ceramic substrate.

FIG. 1 schematically shows the cross section of the substrate after each of the above steps (2-*a*) through (2-*j*). Hereinafter, each of the steps will be explained with reference to FIGS. 1 and 2.

(Step (2-*a*))

In the step (2-*a*), a sintered ceramic substrate 10 having a through-hole 12 is prepared. As the sintered ceramic substrate 10, a known substrate made of ceramics can be used without particular limitations.

Examples of the ceramics to constitute the sintered ceramic substrate 10 are (1) oxide-based ceramics, such as aluminum oxide-based ceramics, silicon oxide-based ceramics, calcium oxide-based ceramics, and magnesium oxide-based ceramics; (2) nitride-based ceramics, such as aluminum nitride-based ceramics, silicon nitride-based ceramics, and boron nitride-based ceramics; (3) beryllium oxide, silicon carbide, mullite, borosilicate glass, and the like. Among them, (2) the nitride-based ceramics are preferred, and particularly, the aluminum nitride-based ceramics can be preferably employed due to high thermal conductivity thereof.

As the sintered ceramic substrate 10 used in the manufacturing method of the present invention, a sintered ceramic substrate containing ceramic particles with an average particle diameter of preferably 0.5 to 20 μm, and more preferably 1 to 15 μm is employed, for the reasons that it can be easily obtained and can be easily formed into a desired shape. Such a sintered ceramic substrate can be obtained by firing a green sheet made of a ceramic base powder with an average particle diameter of 0.1 to 15 μm, and preferably 0.5 to 5 μm.

The green sheet may contain a sintering aid, an organic binder, and the like. As the sintering aid, a sintering aid usually employed in accordance with the type of the ceramic base powder can be used without particular limitations. Moreover, as the organic binder, polyvinyl butyral, ethyl celluloses, and acrylic resins are used. For the reason of good formability of the green sheet, poly(n-butyl methacrylate) and polyvinyl butyral are particularly preferably used.

From the viewpoint of the thermal conductivity of the obtained sintered body, it is preferable to use a green sheet for nitride ceramics formed by using, as the ceramic base powder, a nitride ceramic powder containing the sintering aid, and particularly a green sheet for aluminum nitride using, as the base powder, an aluminum nitride powder containing the sintering aid (e.g. yttrium, calcium oxide).

The shape of the sintered ceramic substrate 10 used in the present invention is not particularly limited as long as it allows the through-hole to be formed in the sintered ceramic substrate. A plate-shaped body or a body obtained by partially cutting the plate-shaped body may be employed as well. The size of the sintered ceramic substrate 10 is not particularly limited and may be adequately determined depending on the application thereof. For example, if the sintered ceramic substrate 10 is to be used as a substrate for mounting an electronic component, the thickness of the substrate is generally 0.1 to 2 mm, and may be preferably 0.2 to 1 mm.

In the sintered ceramic substrate 10 described above has the through-hole 12 formed therein. A method of forming the through-hole 12 is not particularly limited. It may be formed by mechanical drilling using a drill, or may be drilled by dissolving ceramics in a method using chemicals. It can also be formed by laser processing, blast processing, or some other means. Additionally, in the application that does not strictly require positional accuracy of the through-hole 12, a green sheet having a through-hole formed in advance by punching processing may be fired to prepare the sintered ceramic substrate 10 having the through-hole 12. The diameter of the through-hole 12 is usually set to be 0.05 mm to 0.5 mm.

The through-hole 12 is basically a through-hole vertically passing through the substrate 10; however, in cases where the substrate 10 has internal wiring, it may be a hole having an opening only at one end. Such a hole is also included in the through-hole 12 of the present invention.

(Step (2-b))

Next, a first metal paste 20 is filled into the through-hole 12 described above, wherein the first metal paste contains a powder of a metal (B) having a melting point higher than a melting point of a metal (A), and an active metal powder. The first metal paste 20 contains the powder of the metal (B) and the active metal powder, and may further contain an organic binder, an organic solvent, a dispersant, a plasticizer, and the like.

The "metal (B)" is a metal having a melting point higher than the melting point of the metal (A). Thus, the "metal (A)" will be explained first. The metal (A) is a metal having a melting point of 600° C. to 1100° C.; and examples thereof are: copper, silver, gold, and solder materials such as gold solder and silver solder. Among these, it is preferable to use, as the metal (A), one or more selected from a group consisting of gold solder, silver solder, and copper in view of cost; and the silver solder being a silver-copper alloy is particularly preferred. If the melting point of the metal (A) is less than 600° C., it is difficult to form an active layer explained later, between a via 23 and the sintered ceramic substrate 10 by the firing. Further, if the melting point of the metal (A) is over 1100° C., excessive heat is applied to the substrate in performing the firing, likely causing stress in the formation of the via to remain in the substrate.

Moreover, the expression, "having a higher melting point than the melting point of the metal (A)" does not necessarily mean that the melting point is over 1100° C., but means that the melting point of the metal (B) is higher than the melting point of the metal (A) actually used. For example, if the metal (A) is silver solder having a melting point of about 780° C., a metal having a melting point higher than 780° C. can be used as the metal (B).

Examples of the metal (B) include copper (melting point: 1085° C.), silver (melting point: 962° C.), gold (melting point: 1064° C.), tungsten (melting point: 3410° C.), and molybdenum (melting point: 2617° C.); and the metal (B) is selected based on the melting point of the metal (A). Among these, it is preferable to use, as the metal (B), one or more selected from a group consisting of silver, copper, and gold, as they have high conductivity; and copper is especially preferred. Two or more types of the metal (B) may be used in mixture as long as the melting point of the metal (B) is higher than the melting point of the metal (A).

The average particle diameter (D50) of the powder of the metal (B) is preferably set to be 1 to 50 µm in order to improve productivity and to manufacture the metallized via-holed ceramic substrate having excellent performance, although it may need to be balanced with the size of other metal powders and the size of the through-hole. In particular, with the average particle diameter (D50) of the powder of the metal (B) set to be 50 µm or less, it is possible to ensure the filling performance even for a small-diameter via. Moreover, two or more types of powders having different average particle diameters can be also used as the powder of the metal (B), in order to increase the packing density of the powder of the metal (B) in the through-hole 12. Herein, the average particle diameter (D50) is a median diameter measured by laser diffractometry using Microtrack manufactured by Nikkiso Co., Ltd.

A difference in melting point between the metal (A) and the metal (B) is preferably 50° C. or more, more preferably 100° C. or more, and still more preferably 150° C. or more. By setting the difference in melting point to be 50° C. or more, it is possible, in the firing step, to melt the metal (A) with the shape of the via maintained without melting the metal (B), to fill up the voids generated upon sintering of the metal (B), and to thereby form the dense via. The upper limit of the difference in melting point is not particularly limited; however, in view of normal manufacturing, it is 3000° C., and more preferably 1000° C. If two or more types of metal (B) are used, the difference in melting point between the metal (A) and all the types of metal (B) preferably satisfies the above range.

The "active metal powder" is formed of a metal which is reactive with the ceramic component, and forms an active layer in the interface with the sintered ceramic substrate 10 by the reaction with the ceramic component. Examples of such an active metal powder may be a titanium powder or a titanium hydride powder. Among them, the titanium hydride powder is preferably used in view of production stability. If a nitride ceramic substrate is used as the sintered ceramic substrate 10, using a metal paste containing the titanium hydride powder allows a titanium nitride layer being the active layer to be formed between the electroconductive via 23 formed by the firing and a wall face of the sintered ceramic, substrate 10. This improves adhesion between the electroconductive via 23 and the sintered ceramic substrate 10. Accordingly, the adhesion of the via can be ensured even in the case of using, as the metal (B), a paste of gold, silver, or copper, which exhibits less adhesion with ceramics. The amount of the active metal powder added is preferably 1 part by mass or more, and more preferably 1.5 parts by mass or more, and on the other hand, preferably 10 parts by mass or less, and more preferably 6 parts by mass or less, based on 100 parts by mass of the powder of the metal (B) in the first metal paste 20. With the above lower limit of the amount of the active metal powder added, it is possible to favorably form the active layer at the time of the firing, thereby enabling improved adhesion between the via and the sintered ceramic substrate. Moreover, with the above upper limit of the addition amount of the active metal powder, it is possible to improve the conductivity of the electroconductive surface layer.

The average particle diameter (D50) of the active metal powder is set to be preferably 0.5 to 50 µm, and more preferably 1 to 50 µm, in order to improve productivity and to manufacture the metallized via-holed ceramic substrate having excellent performance, particularly having improved adhesion of the electroconductive via 23 and excellent conductivity, although it may need to be balanced with the size of other metal powders and the size of the through-hole. With the above lower limit of the average particle diameter (D50) of the active metal powder, it is possible to inhibit deactivation of the active metal powder caused by surface oxidation. Further, with the above upper limit of the average particle diameter (D50) of the active metal powder, it is possible to ensure the filling performance even for a small-diameter via. Herein, the average particle diameter (D50) is a median diameter measured by laser diffractometry using Microtrack produced by Nikkiso Co., Ltd, as mentioned above.

As the organic binder to be contained in the first metal paste 20, a known binder can be used without particular limitations. For example, it is possible to use one or a mixture of two or more selected from: acrylic resins such as polyacrylic acid ester and polymethacrylic acid ester; cellulose-based resins such as methylcellulose, hydroxymethyl cellulose, nitrocellulose, and cellulose acetate butyrate; polyvinyl resins such as polyvinyl butyral, polyvinyl alcohol, and polyvinyl chloride; hydrocarbon resins such as polyolefin; oxygen-containing resins such as polyethylene oxide, and so on.

As the organic solvent to be contained in the first metal paste 20, a known organic solvent can be used without particular limitations. For example, toluene, ethyl acetate, terpineol, butyl carbitol acetate, texanol, and the like can be used. As the dispersant to be contained in the first metal paste 20, a known dispersant can be used without particular limitations. For example, a phosphate-based dispersant, a polycarboxylic acid-based dispersant, and the like can be used. As the plasticizer to be contained in the first metal paste 20, a known plasticizer can be used without particular limitations. For example, dioctyl phthalate, dibutyl phthalate, diisononyl phthalate, diisodecyl phthalate, dioctyl adipate, and the like can be used.

A method of filling the first metal paste 20 into the through-hole 12 is not particularly limited and is performed using a known screen printing apparatus, an apparatus for pressure filling the paste, or some other means. The first metal paste 20 is filled so as to fill up the through-hole 12 uniformly. Taking it into account that the metal (B) in the first metal paste 20 contracts upon drying and sintering, the first metal paste 20 may be filled in a manner protruding upward and downward from the through-hole 12.

Herein, the first metal paste 20 containing the powder of the metal (B) and the active metal powder described above is preferably adjusted to have a viscosity of 50 to 3000 Pa·s at 25° C. in the state of containing the organic solvent and the organic binder, in view of the productivity of the metallized via-holed ceramic substrate.

(Step (2-c))

A second metal paste is applied on at least one face of the sintered ceramic substrate 10, thereby forming a second metal paste layer 24 where the second metal paste contacts with the first metal paste 20 filled in the through-hole in the above step (2-b).

The second metal paste contains a powder of a metal (B') having a melting point higher than the melting point of the above metal (A) and an active metal powder. The metal (B') may be selected in the same way as the metal (B) of the above first metal paste; and the active metal may be selected in the same way as the active metal of the above first metal paste. Further, the second metal paste may be the same as the above first metal paste. However, in the method for manufacturing a metallized via-holed ceramic substrate of the present invention, the powder of the metal (A) in the third metal paste melts, and the metal (A) component thus melted passes through the second metal paste layer 24 to flow into voids among the powder particles of the metal (B) of the first metal paste 20 in the through-hole 12. A part of the metal (A) component thus melted is also absorbed into the second metal paste layer 24 to likely cause local variation of the composition of the second metal paste layer 24. Therefore, in view of stabilizing the properties of an electronic circuit formed on a manufactured metallized via-holed ceramic substrate, it is desired to stabilize the composition of the electroconductive surface layer 30 against such a perturbative factor.

Therefore, when there is a metal element which constitutes the powder of the metal (A) and has a melting point higher than the melting point of the metal (A) as an elemental metal, the second metal paste preferably contains an elemental metal powder of this metal element as the powder of the metal (B'). It may also contain other powders of metals as the powder of the metal (B').

For example, if the metal (A) contains a silver-copper alloy solder, the powder of the metal (B') preferably contains both a copper powder and a silver powder, since copper and silver as the constituent metal elements both have a melting point higher than the melting point of the metal (A). Selecting the metal (B') in this way can inhibit composition variation of the electroconductive surface layer 30 even in the case when a part of the melted metal (A) is absorbed into the second metal paste layer 24.

When the metal (A) contains the silver-copper alloy solder, and the powder of the metal (B') contains the copper powder and the silver powder as in the above example, it is possible to form a denser electroconductive surface layer 30 upon firing especially by the presence of the silver powder, and therefore possible to reduce the layer thickness compared with the case of using only the copper powder as the powder of the metal (B'). As a result, the total amount of the active metal powder contained in the second metal paste layer 24 can be reduced, therefore allowing an active layer 29 formed by the firing to be thin and enabling reduction of the time required for etching the active layer 29 described below.

In specific, the average particle diameter (D50) of the powder of the metal (B') contained in this second metal paste is preferably 0.1 to 20 and especially preferably 0.1 to 2 µm in order to form the denser electroconductive surface layer 30. Further, the powder of the metal (B') may employ two or more powders having different average particle diameters in order to form the denser electroconductive surface layer 30. Furthermore, as the powder of the metal (B'), two or more types may be used in mixture like copper and silver in the above example as long as the melting point thereof is higher than the melting point of the metal (A) in the third metal paste. When the powder of the metal (B') contains the copper powder and the silver powder as in the above example, a mixing ratio is preferably adopted in which the amount of silver is for example 10 to 30 parts by mass with respect to 100 parts by mass of copper, in view of improving densification of the electroconductive surface layer 30 and the active layer 29 and inhibiting a residue at the time of etching.

On the other hand, the average particle diameter (D50) of the active metal powder contained in the second metal paste is preferably 0.1 µm or more, and especially preferably 0.5 µm or more in view of enabling inhibition of generation of voids caused by deactivation of the active metal powder due to surface oxidation. On the other hand, the average particle diameter (D50) of the active metal powder in the second metal paste is preferably 20 µm or less, and more preferably 5 µm or less in view of forming the electroconductive surface layer 30 having a smoother surface. Additionally, in view of surface smoothness, the ratio of a coarse particle having a sphere equivalent diameter of over 5 µm is further preferably 5% or less in a volume distribution measured by laser diffractometry; and not containing the coarse particle is especially preferable. In view of restricting or excluding the coarse particle of the active metal powder in this way, the active metal powder (for example a titanium hydride powder) is preferably pulverized and/or classified to be used. The pulverization may be done before preparation of the second metal paste, or may be done in preparation of the second metal paste. For example, each component of the second metal paste is quantified; they are mixed by a stirring-defoaming apparatus (e.g. a planetary stirring-defoaming apparatus (MAZERUSTAR, manufactured by Kurabo Industries Ltd.)); and thereafter they are kneaded to be mixed well, and broken up by a three-roll mill (at this time, the coarse particle of the titanium hydride powder is broken up concurrently). Thereby the second metal paste is favorably prepared.

Additionally, in view of the adhesion, densification, conductivity and the like of the electroconductive surface layer 30 formed, the addition amount of the active metal powder in the second metal paste is preferably 5 parts by mass or more and inure preferably 7.5 parts by mass or more, and on the other hand preferably 50 parts by mass or less and more preferably 27.5 parts by mass or less, based on 100 parts by mass of the metal (B') in the second metal paste. With the lower limit of the content of the active metal powder as above, it is possible to improve adhesion of the electroconductive surface layer 30 and also possible to improve the conductivity of the electroconductive surface layer 30 with generation of voids in the layer inhibited. Further, since a liquid phase generated by the melting upon firing can be secured at a certain level or more, the smoothness of the electroconductive surface layer 30 can be enhanced. Furthermore, with the upper limit of the content of the active metal powder as above, it is possible to reduce the electrical resistance, and also possible to easily perform an etching process of the active layer 29 described below.

The second metal paste may further contain an organic binder, an organic solvent, a dispersant, a plasticizer, and the like, like the first metal'paste. In view of the productivity of the metallized via-holed ceramic substrate, the second metal paste preferably has a viscosity of 10 to 600 Pa·s at 25° C., and more preferably has a viscosity of 20 to 300 Pa·s at 25° C., in a state of containing the organic solvent and the organic binder.

An example of an especially preferred configuration of the second metal paste is a configuration of containing a highly viscous solvent having a viscosity of 100 Pa·s or more at 25° C. The content of the highly viscous solvent is preferably 7.5 parts by mass or more, and more preferably 15 parts by mass, and on the other hand, preferably 45.5 parts by mass or less, and more preferably 36.5 parts by mass or less, based on 100 parts by mass of the powder of the metal (B'). With the content of the highly viscous solvent set in the above range, it is possible to reduce the content of the binder component and to form a dense and thin metal layer with the viscosity of the metal paste composition secured, as will be explained below in detail. The inventors assume the reason for this as follows. As the highly viscous solvent vaporizes to be removed upon firing, it can be easily removed compared with a binder component which is removed by pyrolysis. This is seen to enable formation of a dense metal layer even if the layer is thin. The upper limit of the viscosity of the highly viscous solvent at 25° C. is not particularly limited as long as the highly viscous solvent can vaporize to be removed upon firing; however it is usually 1000 Pa·s.

Preferred examples of the highly viscous solvent described above that can be contained in the second metal paste include: isobornylcyclohexanol (MTPH). Isobornylcyclohexanol can be suitably employed since it has high temperature dependency of the viscosity.

Further, in the case of including the above highly viscous solvent in the second metal paste, the viscosity of the second metal paste composition is especially preferably 10 Pa·s or more and 100 Pa·s or less at 25° C., in view of its printability and its adhesion to the sintered substrate.

An ordinary solvent may also be added to the metal paste composition in combination with the highly viscous solvent, as long as the metal paste composition formed has a viscosity in the above range. Examples of the ordinary solvent include: toluene, ethyl acetate, terpineol, butyl carbitol acetate, and texanol. Furthermore, in order to improve the printability and the preservation stability, a know surfactant, plasticizer and the like may be added. Examples of the dispersant that can be favorably employed include: a phosphate-based dispersant and a polycarboxylic acid-based dispersant.

Furthermore, in the case of containing the above highly viscous solvent, the second metal paste composition does not contain a binder component; or even if it does, the content of the binder component is preferably less than 4.7 parts by mass, more preferably 2.5 parts by mass or less, and still more preferably 1.5 parts by mass or less, based on 100 parts by mass of the powder of the metal (B'). With the content of the binder component in the second metal paste composition set within the above range, it is possible to easily ensure densification of the metal layer upon firing. In this case as well, the viscosity of the metal paste composition at 25° C. is especially preferably set to be 10 Pa·s or more and 100 Pa·s or less.

The second metal paste composition in the configuration of containing the highly viscous solvent described above does not contain the binder component, or contains a limited amount thereof, thus the solid content concentration being low. It is therefore possible to improve the leveling of the metal paste composition (reduce the mesh marks left at a time of screen printing), and to reduce the printed layer thickness.

The second metal paste layer 24 is formed by applying the above described second metal paste on a face of the sintered ceramic substrate 10 on which to form a metallized pattern so that the second metal paste contacts with the first metal paste 20. Usually, the second metal paste is applied all over the face on which to form the metallized pattern, to thereby form the second metal paste layer 24; however, it does not necessarily have to be applied on the entire face. In general, the metal paste composition is applied over one entire face of the sintered ceramic substrate 10, and the electroconductive surface layer 30 (and the active layer 29) is (are) formed on this face. However, the metal paste composition may be applied all over both faces of the sintered ceramic substrate 10, to thereby form the electroconductive surface layer 30 (and the active layer 29) on both faces.

The thickness of the second metal paste layer 24 is preferably set such that the thickness obtained after the firing is 0.5 to 15 μm, in order to make the etching process easy.

(Step (2-*d*))

Figure 2:
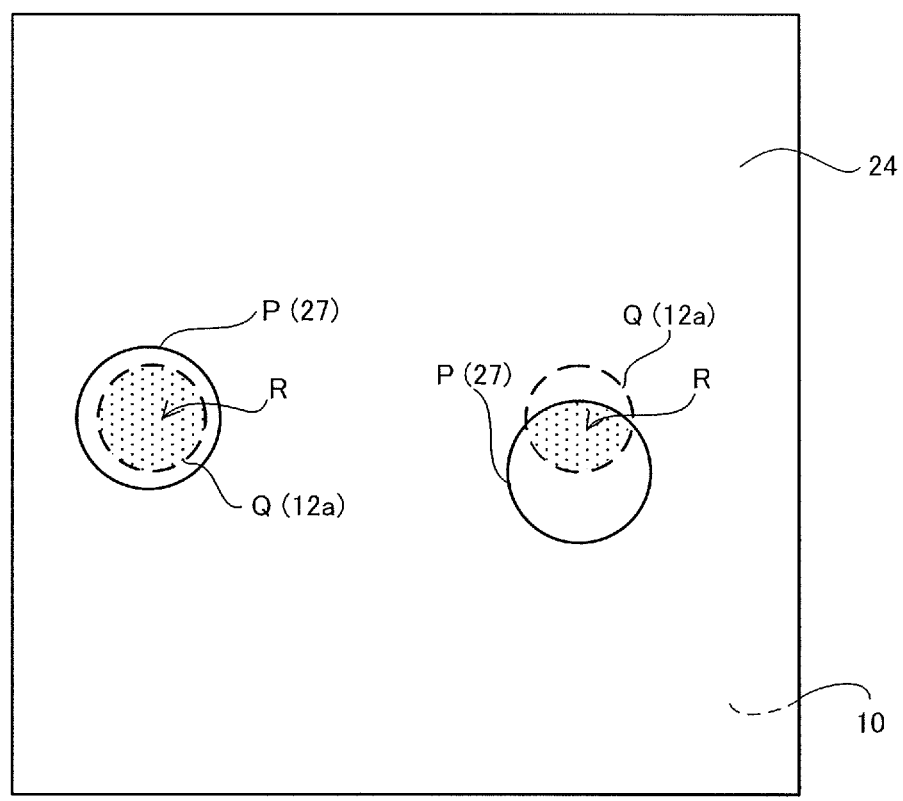
FIG. 2 is a penetrative plan view (viewed along A-A) of the substrate after the step (2-*d*) in FIG. 1.

The step (2-*d*) is the step of applying a third metal paste containing the powder of the metal (A) on the second metal paste layer 24, thereby forming a third metal paste layer 27. FIG. 2 is a penetrative plan view (viewed along A-A) of the substrate after the step (2-*d*) in FIG. 1. The part that cannot be seen directly in the view along A-A is indicated by a broken line.

The third metal paste contains the powder of the metal (A) described above, and may also contain other components like the first metal paste. The third metal paste is layered on the second metal paste layer 24, to thereby form the third metal paste layer 27. At this time, as shown by the through-holes 12, 12 in FIG. 2, an area P where the third metal paste layer 27 is formed needs to overlap with an area Q to share an overlapping part R in the penetrative plan view of the sintered ceramic substrate 10, the area Q being an area occupied by an opening 12*a*, out of both ends 12*a*, 12*b* of the through-hole 12, the opening 12a being in contact with the second metal paste layer 24 in contact with the third metal paste layer 27 formed. By forming the third metal paste in this position, the metal (A) melted in the firing step can flow into the voids among the powder particles of the metal (B) filled in the through-hole 12. The area Q occupied by the opening 12a does not necessarily have to be included in the area P; and there may be a part of the area Q occupied by the opening 12a that is not included in the area P, as shown by the through-hole 12 on the right side of FIG. 2 for example. However, in view of letting the melted metal (A) easily flow into the through-hole 12, it is preferable for the area Q occupied by the opening 12a to be included in the area P, as shown by the through-hole on the left side of FIG. 2. Herein, it is good as long as the area P and the area Q overlap with each other in the penetrative plan view, and thus other positional relations are not particularly limited. For example, the area P may be on the upper side of the area Q in the vertical direction, or vice versa.

The powder of the metal (A) to be contained in the third metal paste is selected from those described in the above descriptions on the step (2-b). The third metal paste may contain only the powder of the metal (A) as an electroconductive component, but may also contain the powder of the metal (B).

The average particle diameter (D50) of the powder of the metal (A) contained in the third metal paste is preferably 1 to 50 μm. If the powder of the metal (B) is added to the third metal paste, the average particle diameter (D50) of the powder of the metal (B) is preferably 0.1 to 10 μm.

The third metal paste may further contain an organic binder, an organic solvent, a dispersant, a plasticizer, and the like, as the first metal paste may; and is preferably adjusted to have a viscosity of 20 to 600 Pa·s at 25° C. in a state of containing the organic solvent and the organic binder, in view of the productivity of the metallized via-holed ceramic substrate 100a.

The third metal paste layer 27 can be formed by a known method such as screen printing, calendar printing, or pad printing of the third metal paste.

The third metal paste layer 27, upon firing, melts and flows into not only the electroconductive via 23 formed (voids among the powder particles of the metal (B) in the first metal paste 20 in the through-hole 12) but also the electroconductive surface layer 30 (voids among the powder particles of the metal (B') in the second metal paste layer 24). Therefore, it needs to be formed such that an amount thereof is ensured. Accordingly, the amount of the metal (A) in the third metal paste layer 27 is preferably 20 parts by mass or more, and more preferably 40 parts by mass or more, and preferably 150 parts by mass or less, and more preferably 100 parts by mass or less, based on 100 parts by mass of the total of the metal (B) in the first metal paste 20 in the through-hole 12 and the metal (B') in the second metal paste layer 24.

However, if the elemental metal powder of the metal element which constitutes the metal (A) in the third metal paste layer and has a melting point higher than the melting point of the metal (A) is added to the second metal paste layer 24 as the powder of the metal (B') for the purpose of stabilizing the composition of the electroconductive surface layer 30, it is preferable to minimize the amount of the third metal paste layer 27 to flow into the electroconductive surface layer 30 upon firing. Therefore in this case, only the metal (B) in the first metal paste needs to be taken into account; and the amount of the metal (A) in the third metal paste layer 27 is preferably 20 parts by mass or more, and more preferably 40 parts by mass or more, and preferably 150 parts by mass or less, and more preferably 100 parts by mass or less, based on 100 parts by mass of the metal (B) in the first metal paste 20 in the through-hole 12.

If the metal (B) is added to the third metal paste layer 27, the amount of the metal (A) in the third metal paste layer 27 is preferably 20 parts by mass or more, and more preferably 40 parts by mass or more, and preferably 150 parts by mass or less, and more preferably 100 parts by mass or less, based on 100 parts by mass of the total of the metal (B) and the metal (B') in the first metal paste 20 in the through-hole 12, the second metal paste layer 24, and the third metal paste layer 27.

Further, when the third metal paste layer 27 contains the metal (B), the content ratio thereof is preferably 5 parts by mass or more and 100 parts by mass or less, and more preferably 10 parts by mass or more and 80 parts by mass or less, based on 100 parts by mass of the total amount of the metal (B') in the second metal paste layer 24.

The third metal paste layer 27 may be in a multilayer structure. For example, a third metal paste layer 27X containing the powder of the metal (A) can be layered on The second metal paste layer 24, and a third metal paste layer 27Y containing the powder of the metal (A) can be further layered thereon. At this time, the amount of the powder of the metal (A) preferably satisfies the content mentioned above, in terms of the total of the third metal paste layer 27X and the third metal paste layer 27Y. The same shall also apply in the case of using the powder of the metal (B).

Figure 5A:
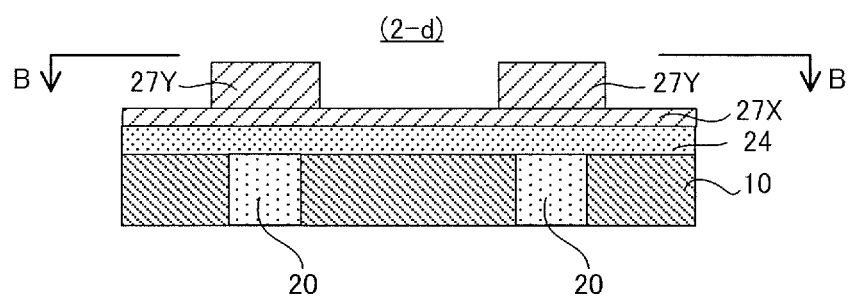
FIG. 5A is a cross-sectional view of the substrate corresponding to (2-*d*) of FIG. 1.
Figure 5B:
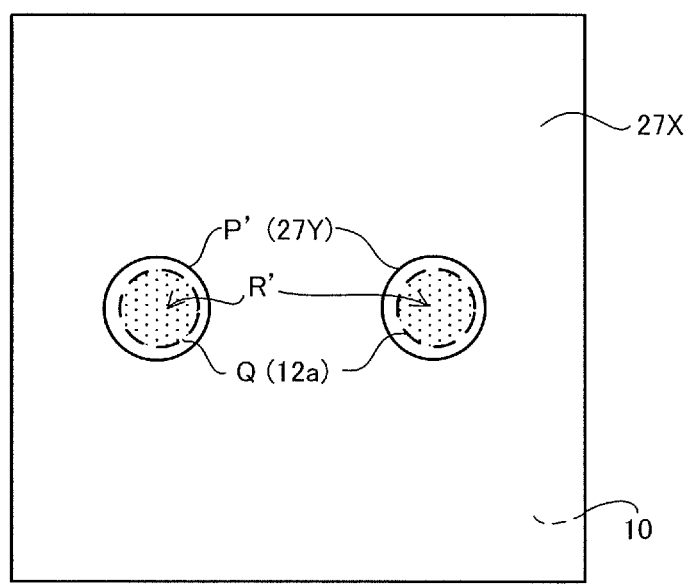
FIG. 5B is a penetrative view along B-B in FIG. 5A.

With the third metal paste layer in a multilayer structure, the third metal paste layer 27X is layered on the second metal paste layer 24 for example in a manner to cover it entirely as show in FIG. 5A, and the third metal paste layer 27Y is layered thereon for example substantially cylindrically as shown in FIG. 5A and FIG. 5B, which is a penetrative view along B-B of FIG. 5A. Thereby, upon firing, the third metal paste layer 27X can efficiently flow into the second metal paste layer 24, and the third metal paste layer 27Y can efficiently flow into the first metal paste 20 in the through-hole 12 and into the second metal paste layer 24. In this case as well, an area P' where the third metal paste layer 27Y is formed preferably overlaps with an area Q to share an overlapping part R' in the penetrative plan view of the substrate (i.e. FIG. 5B as a penetrative view along B-B of FIG. 5A), the area Q being an area occupied by the opening 12a, out of both ends 12a, 12b of the through-hole 12, the opening 12a being in contact with the second metal paste layer 24 in contact with the third metal paste layer 27X in contact with the third metal paste layer 27Y formed; and the area P' preferably includes the area Q.

The ratio of the volume of the third metal paste layer 27 to the volume of the first metal paste 20 in the through-hole 12 (volume of the third metal paste layer 27/volume of the first metal paste 20 in the through-hole 12) is preferably 0.3 or more, and more preferably 0.5 or more in view of forming the dense electroconductive via 23 with generation of voids in the via inhibited; and on the other hand it is preferably 1.5 or less, and more preferably 1 or less in view of reducing the composition variation of the electroconductive surface layer 30 and of ensuring the etching performance of the electroconductive surface layer 30.

(Step (2-e))

The step (2-e) is the step of firing the substrate obtained in the preceding steps. Through this step, the electroconductive via 23 is formed in the through-hole 12; the electroconductive surface layer 30 is formed on the sintered ceramic substrate 10; and the active layer 29 is formed in the interface between the electroconductive surface layer 30 and the sintered ceramic substrate 10. An active layer is formed also in the interface between the electroconductive via 23 and the sintered ceramic substrate 10 (a wall face of the through-hole 12), although not shown in the figure for simplification.

The firing may be performed at a temperature which is equal to or above the melting point of the metal (A) and less than the melting point of the metals (B) and (B'), depending on the nature of the metal paste used (more specifically, the nature of the powder of the metal in the metal paste). For other conditions, normally adopted conditions are adequately employed.

For example, if a powder of a Ag—Cu alloy (silver solder) having a melting point of 780° C. is used as the metal (A), a copper powder is used as the powder of the metal (B), and a copper powder and a silver powder are used as the powder of the metal (B'), the firing may be performed at 780 to 1050° C., preferably at 800 to 950° C., for several ten seconds to 1 hour, preferably 5 to 30 minutes.

According to the present invention, even if a high-melting-point metal such as tungsten and molybdenum is used as the metal (B), the metallized via-holed ceramic substrate can be manufactured at a temperature lower than a firing temperature usually employed in firing such high-melting-point metals. For example, when the high-melting-point metal is used, the firing usually needs to be performed at a temperature of 1600 to 2000° C. in order to sinter the high-melting-point metal. In the present invention, however, because the third metal paste layer 27 containing the powder of the metal (A) is used, performing the firing at a temperature equal to or above the melting point of the metal (A) allows the metal (A) to melt and permeate into the powder of the high-melting-point metal, thereby enabling formation of the electroconductive via 23 with good conductivity, even if the temperature does not cause complete sintering of the high-melting-point metal.

Moreover, an active metal powder (e.g. a titanium hydride powder) is contained in the first metal paste 20, to provide adhesion with the sintered ceramic substrate 10. Thus, the firing is preferably performed in a non-oxidizing atmosphere in a heat-resistant container.

Examples of the non-oxidizing atmosphere may be a vacuum atmosphere, an atmosphere of an inert gas such as argon gas and helium gas, and an atmosphere of hydrogen gas. Moreover, it may be a mixed atmosphere of the inert gas and the hydrogen gas. Among these non-oxidizing atmospheres, the vacuum atmosphere or the mixed atmosphere of the inert gas and the hydrogen gas is preferably adopted. When the firing is performed under vacuum, the degree of vacuum is preferably as high as possible to prevent a reactive gas such as oxygen and nitrogen in the atmosphere from reacting with titanium, and is preferably $1.33 \times 10^{-1}$ Pa or less, and more preferably $1.33 \times 10^{-2}$ Pa or less. The upper limit of the degree of vacuum is not particularly limited, but is $1.33 \times 10^{-4}$ Pa or more in view of industrial production.

The heat-resistant container is not limited as long as it is formed of a material sufficiently resistant to the firing temperature; and it preferably does not transmit gas, does not generate gas from the container itself, and is highly airtight even under the high temperature upon firing. Specific examples of the material to be preferably used for the heat-resistant container include: a sintered body of a nitride such as aluminum nitride, boron nitride, and silicon nitride; a sintered body of an oxide such as alumina, magnesia, and zirconia; heat-resistant alloys such as Incoloy and Hastelloy; and quartz glass. Among them, the sintered nitride excellent in thermal conductivity is preferred in view of ensuring heat evenness in the container during firing.

The heat-resistant container is thought to function, in the firing step, to block an atmosphere near the substrate from the other atmosphere in the firing furnace and to inhibit contaminants such as decomposition products resulting from a binder component in a paste decomposed, scattered, and re-deposited on a wall of the furnace and so on, from being re-scattered with an increasing temperature inside the furnace and reacting with an active metal component (e.g. a titanium component) in the metal paste layer. Therefore, it is preferable to use a heat-resistant container configured such that a lid can be put thereon so as to be able to block the atmosphere near the substrate in the firing step from the other atmosphere in the firing furnace. The heat-resistant container may be completely closed, or may have a gap to the extent that a gas generated by the pyrolysis of the binder in the metal paste can be released out of the container.

The shape of the heat-resistant container is preferably in a size which does not cause temperature distributions in the heat-resistant container in the firing furnace. For this reason as well, the heat-resistant container is preferably made of the sintered nitride excellent in thermal conductivity.

By adopting the particular firing conditions described above, it is possible to prevent migration of the active metal component to an exposed surface of the via 23 more effectively. Thus, adopting the above particular firing conditions enables the active layer 29 to be sufficiently formed in the interface between the electroconductive via 23 and the sintered ceramic 10, thereby providing good adhesion between them.

In the method for manufacturing the metallized via-holed ceramic substrate of the present invention, in the firing step, the powder of the metal (A) in the third metal paste layer 27 melts and permeates into the electroconductive surface layer 30 (the voids among the powder particles of the metal (B') in the second metal paste layer 24) thereunder, and into the via 23 (the voids among the powder particles of the metal (B) in the through-hole 12). Thereby, the via 23 and the electroconductive surface layer 30 which are dense and have good electroconductivity is formed. Further, the formation of the active layer 29 between the electroconductive surface layer 30 and the sintered ceramic substrate 10 by the reaction of the active metal in the second metal paste layer 24 with the ceramic component of the sintered ceramic substrate 10 enables good adhesion of the electroconductive surface layer 30.

Herein, an electroconductive metal layer formed as the via 23 may have a sea-island structure in which the metal (B) is the island and the metal (A) is the sea with the particle shape of the metal (B) before the firing maintained to some extent. Moreover, it may also have a structure in which the metal (A) is mixed in the metal (B) or in which the metal (B) is mixed in the metal (A). The same shall apply to the metal (B') and the metal (A) in the electroconductive surface layer 30.

The metal constituting the post-firing via 23 may have the island mainly composed of the metal (A) and the sea mainly composed of the metal (B), or may have the metal (A) and the metal (B) completely solid-dissolved, depending on the firing temperature, and the type and content of the metal (A) and the metal (B). For example, if a copper-silver alloy (silver solder) is used as the metal (A) and copper is used as the metal (B), there appear, upon firing, a solid phase having copper (partially having silver and the active metal solid-dissolved) and a liquid phase having copper (and the active metal) further dissolved in silver solder (silver-copper), and then they are phase-separated into a phase mainly composed of copper and a phase mainly composed of silver upon cooling and solidification after the firing. This ends up in a material structure having the phase mainly composed of copper as the sea and the phase mainly composed of silver as the island. Accordingly, the melting points of the metal (A) and the metal (B) originally contained in the metal paste may differ from the melting points of the metal which constitutes the island and the metal which constitutes the sea in the metal in the via obtained after the firing. The same shall apply to the metal (B') and the metal (A) in the electroconductive surface layer 30.

There are sometimes recesses and protrusions (unevenness) on the surface of the electroconductive surface layer 30 formed by the above firing step. Therefore, the step of polishing the surface of the electroconductive surface layer 30 to smooth it may be provided before the following step (2-f). The method of polishing the surface is not particularly limited; and mechanical polishing using abrasive grains, chemical polishing using an acid or alkali, or some other means may be employed.

(Step (2-f))

The step (2-f) is the step of forming a plating layer 40 on the electroconductive surface layer 30. The method of forming a plating is not particularly limited. Both electroplating and electroless plating may be adopted and they may be performed in combination. A material of the plating layer may be nickel, gold, silver, copper, etc.; however, copper is preferred. In performing copper plating, a known copper plating liquid such as a copper sulfate plating liquid, a copper pyrophosphate plating liquid, and a copper cyanide plating liquid may be used as a copper electroplating liquid; and the copper sulfate plating liquid is preferred in that it is inexpensive and is low in toxicity. Further, for the purpose of improving the appearance of the plating film, a thin copper strike layer (a layer thickness of 0.05 to 1 µm, for example) may be formed first; and thereafter, a copper plating layer with a desired layer thickness may be formed. The lower limit of the thickness of the plating layer 40 is preferably 2 µm or more, and more preferably 5 µm or more in order to ensure the good conductivity. The upper limit thereof is not particularly limited; however, if the plating layer 40 is too thick, it is likely that the effect of improving the conductivity gets saturated and that a precise wiring is hard to make. Therefore, the upper limit is preferably 200 µm or less, and more preferably 100 µm or less.

The thickness ratio between the electroconductive surface layer 30 and the plating layer 40 is preferably 1/50 or more and 2/30 or less; and the thickness of the plating layer 40 is preferably set to be larger than the electroconductive surface layer 30.

(Step 2-g))

The step (2-g) is the step of forming a resist pattern 50 on a part of the formed plating layer 40 to be left as a wiring pattern, preferably by a photolithographic method. The resist is not particularly limited as long as it can protect the plating layer 40 and the like in a predetermined position in the following etching process; and any type, whether positive or negative, may be employed. For example, a positive type photoresist is applied on the entire face of the plating layer 40; an area except for the part to be left as a wiring pattern is exposed to light; and the exposed part is removed by a developer. Thereby the resist pattern 50 is formed. The developer is not particularly limited, and an ordinary developer such as TMAH may be used. The thickness of the resist pattern 50 is not particularly limited, but it is usually 1 µm or more and 30 µm or less.

(Step (2-h))

The step (2-h) is the step of removing a part of the plating layer 40 and the electroconductive surface layer 30 not covered with the resist pattern 50, by an etching process. Examples of an etching liquid that can be used are known etching liquids for etching a metal layer (metal corrosive chemicals) such as an aqueous ferric chloride solution, an aqueous cupric chloride solution, an ammonia type copper etching liquid containing tetraamminecopper(II) complex ion ($Cu(NH_3))_4^{2+}$), and a sulfuric acid-hydrogen peroxide type etching liquid. Among these, the aqueous ferric chloride solution and the aqueous cupric chloride are preferred in that a wiring pattern with a high etching factor can be obtained. However, if the thicknesses of the copper plating layer 40 and the electroconductive surface layer 30 are small (for example not more than 2 µm), using the aqueous ferric chloride solution or the aqueous copper chloride solution makes it difficult to control an etching time because of their fast etching rate; and therefore the sulfuric acid-hydrogen peroxide type etching liquid, which allows a slow etching rate, is preferred. The method of applying the etching liquid may be immersing the substrate in the etching liquid or spraying the etching liquid on the substrate; however spraying is preferred since a high etching factor can be obtained.

(Step (2-i))

The step (2-i) is the step of removing the resist pattern 50. A remover for removing the resist pattern 50 that can be employed may be an aqueous alkali metal hydroxide solution. The substrate may be immersed in the remover, or the remover may be sprayed on the substrate. For example, the resist pattern 50 can be removed by immersing the substrate in an aqueous NaOH solution with a liquid temperature of 50° C. in 3 mass % for about one minute.

(Step (2-j))

The step (2-j) is the step of etching an exposed part of the active layer 29 formed in the interface between the electroconductive surface layer 30 and the sintered ceramic substrate 10. An etching liquid for etching the active layer 29 that can be employed may be for example the hydrogen peroxide type etching liquid. However, an ammonia-hydrogen peroxide type etching liquid containing ammonia and hydrogen peroxide is especially preferably employed in that it ensures removal of the residue that has not been removed in the preceding step (2-h). As for the liquid property of the etching liquid, the pH is preferably 7 or more in view of improving the etching ability, and preferably 9 or less in view of preventing the plating layer 40 from being etched. The method of applying the etching liquid may be immersing the substrate in the etching liquid, or may be spraying the etching liquid on the substrate. Herein, chelating agents such as EDTA and citric acid may also be contained in order to improve the etching rate and to extend the life of etching liquid.

The metallized via-holed ceramic substrate 100a is manufactured through each of the above steps. A copper plating layer may be formed first, and a plating layer of another metal (for example, a Ni/Au plating layer) may be further formed thereon, as desired based on the purpose of use and so on.

<2. Method for Manufacturing Metallized Via-Holed Ceramic Substrate (Third Aspect of the Present Invention)>

Figure 3:
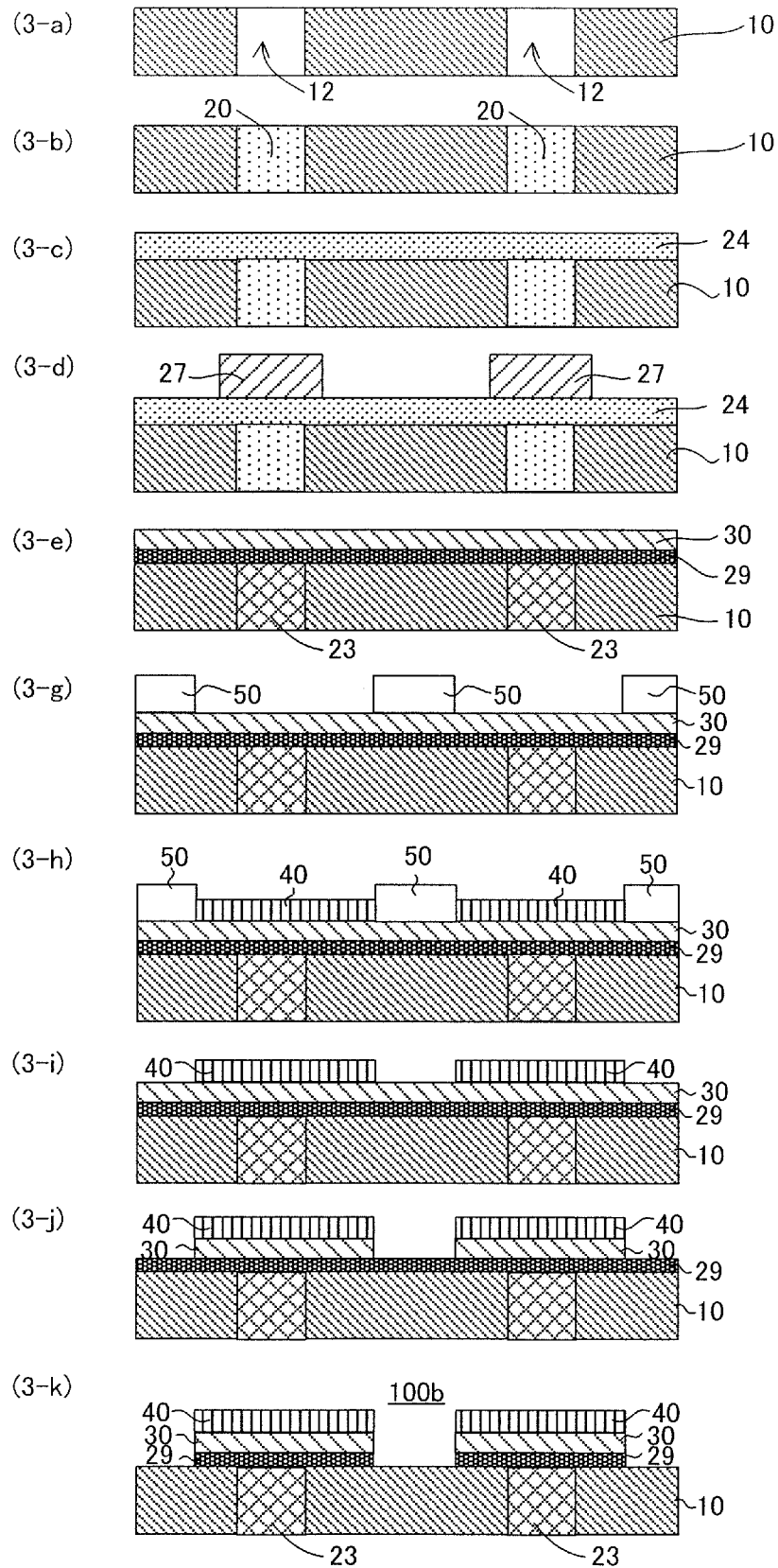
FIG. 3 is a view illustrating one embodiment of the method for manufacturing a metallized via-holed ceramic substrate related to the third aspect of the present invention, with a schematic view of a cross section of the substrate after each step.
Figure 4:
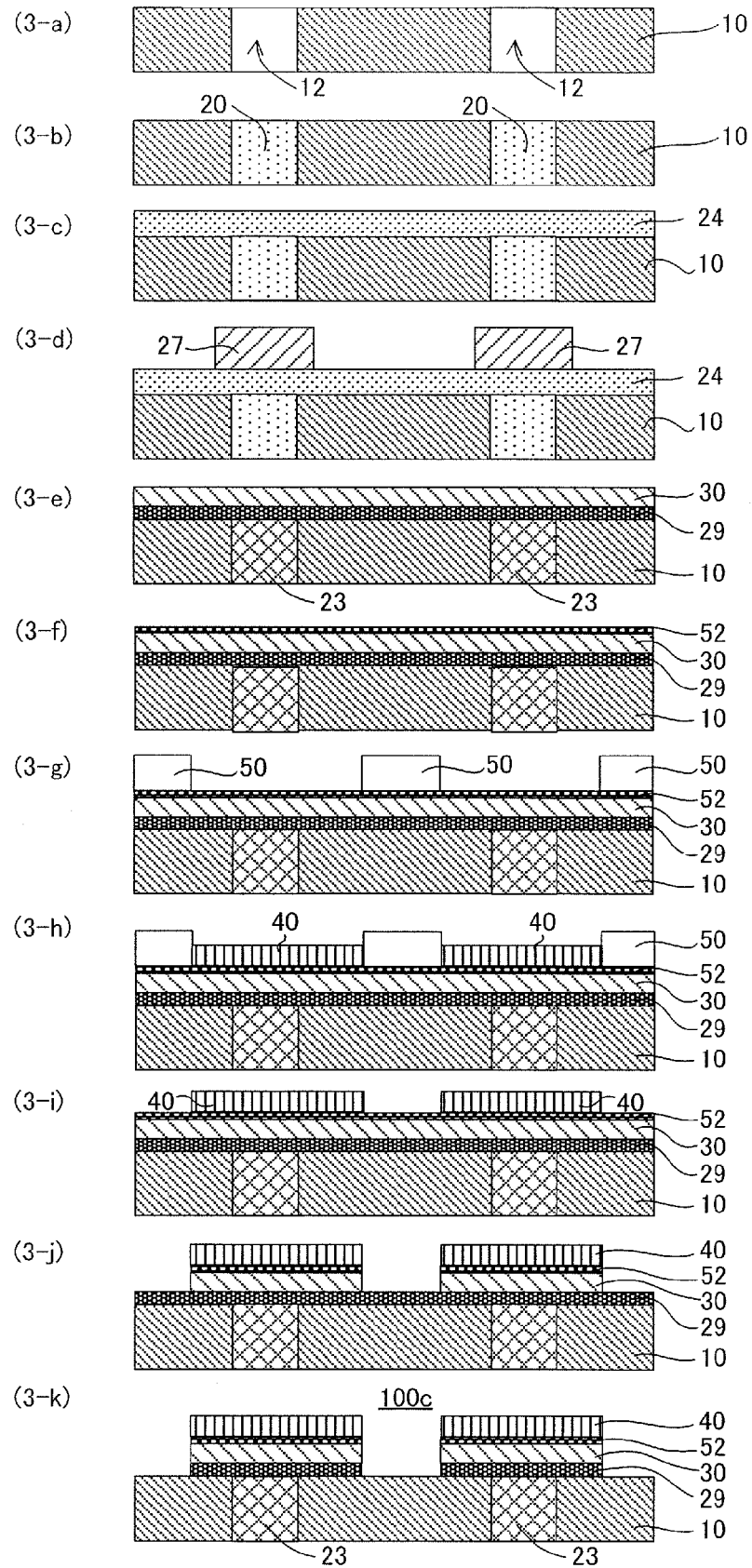
FIG. 4 is a view illustrating another embodiment of the method for manufacturing a metallized via-holed ceramic substrate related to the third aspect of the present invention, with a schematic view of a cross section of the substrate after each step.

Hereinafter, the method for manufacturing a metallized via-holed ceramic substrate as the third aspect of the present invention will be described with reference to FIGS. 3 and 4. FIG. 3 is a view of the steps wherein an anti-oxidation layer 52 is not formed. FIG. 4 is a view of the steps wherein the anti-oxidation layer 52 is formed.

The method for manufacturing a metallized via-holed ceramic substrate as the third aspect of the present invention includes the below steps in the mentioned order:

(3-a) preparing a sintered ceramic substrate 10 having a through-hole 12;

(3-b) filling a first metal paste 20 into the through-hole 12, the first metal paste containing a powder of a metal (B) having a higher melting point than a metal (A) having a melting point of 600° C. to 1100° C., and an active metal powder;

(3-c) applying a second metal paste on at least one face of the sintered ceramic substrate, thereby forming a second metal paste layer 24 where the second metal paste contacts with the first metal paste 20, wherein the second metal paste contains a powder of a metal (B') having a melting point higher than the melting point of the metal (A) and an active metal powder;

(3-d) applying a third metal paste on the second metal paste layer 24, thereby forming a third metal paste layer 27, wherein the third metal paste contains a powder of the metal (A);

(3-e) firing the substrate obtained via the preceding steps, thereby forming an electroconductive via 23 in the through-hole 12, an electroconductive surface layer 30 on the sintered ceramic substrate 10, an active layer 29 in the interface between the electroconductive surface layer 30 and the sintered ceramic substrate 10, and an active layer 29 in the interface between the electroconductive via 23 and the sintered ceramic substrate 10;

if necessary, (3-f) forming an anti-oxidation layer 52 on the electroconductive surface layer 30;

(3-g) forming a resist pattern 50 on a part of the electroconductive surface layer 30 where a wiring pattern is not to be formed; or in the case of performing the above step (3-f), forming a resist pattern 50 on a part of the anti-oxidation layer 52 where a wiring pattern is not to be formed;

(3-h) forming a plating layer 40 on a part of the electroconductive surface layer 30 not covered by the resist pattern 50; or in the case of performing the above step (3-f), forming a plating layer 40 on a part of the anti-oxidation layer 52 not covered by the resist pattern 50;

(3-i) removing the resist pattern 50;

(3-j) etching an exposed part of the electroconductive surface layer 30; or in the case of performing the above step (3-f), etching an exposed part of the anti-oxidation layer 52 and the electroconductive surface layer 30; and (3-k) etching an exposed part of the active layer 29 formed in the interface between the electroconductive surface layer 30 and the sintered ceramic substrate 10.

The steps (3-a) through (3-e) are the same as the steps (2-a) through (2-e) described above. The surface of the electroconductive surface layer 30 may be polished after the step (3-e), which is also the same as described above. Therefore, each step after the step (3-e) will be described below.

(Step (3-f))

Directly after the step (3-e) of forming the electroconductive surface layer 30, the step of forming the resist pattern 50 on a predetermined part of the electroconductive surface layer 30 where a wiring pattern is not to be formed, may be performed as shown in the step (3-g) (see FIG. 3). However, in order to prevent difficulty in removing the oxidation of the surface of the electroconductive surface layer 30 containing an active metal (such as titanium), the anti-oxidation layer 52 may also be formed on the electroconductive surface layer 30 (step (3-f): see FIG. 4). In the step (3-f), the anti-oxidation layer 52 is formed on the electroconductive surface layer 30. In the method of the third aspect of the present invention, the resist pattern 50 is formed on the part where a wiring pattern is not to be formed, and the plating layer 40 is formed on the part where the resist pattern 50 is not formed. Therefore, the surface of the electroconductive surface layer 30 to form the wiring pattern is exposed until the plating layer 40 is formed, likely causing oxidation of the surface. The electroconductive surface layer 30 contains an active metal component (such as titanium), so an oxide film once formed on the surface of the electroconductive surface layer 30 may not be removed completely by an ordinary acid treatment. In order to prevent this, it is preferable to perform this step (3-f) prior to the step (3-g) and to form the anti-oxidation layer 52 on the electroconductive surface layer 30.

The anti-oxidation layer 52 is not particularly limited as long as it can prevent oxidation of the surface of the electroconductive surface layer 30 and is a metal layer that can be easily etched in the following step (3-j). Among various types, a copper plating layer (copper strike plating) for example is preferred in that a thin metal layer having good adhesion can be formed within short time. The copper strike plating may be formed by electroless plating or by electroplating. The layer thickness of the anti-oxidation layer 52 is not particularly limited, but it may be for example 0.05 μm or more and 1 μm or less. Forming such an anti-oxidation layer 52 as above enables easy removal of the oxide layer by an ordinary acid treatment even in the case of the surface oxidation.

(Step (3-g))

In the step (3-g), the resist pattern 50 is formed, preferably by a photolithographic method, on a predetermined part of the electroconductive surface layer 30 formed in the step (3-e) where a wiring pattern is not to be formed, or on a predetermined part of the anti-oxidation layer 52 where a wiring pattern is not to be formed, the anti-oxidation layer 52 being formed in the step (3-f) preformed as necessary. The method of forming the resist pattern is the same as the step (2-g) described above. In the step (3-g), however, the resist pattern is formed on a predetermined part where a wiring pattern is not to be formed; thus in this point, the position of the resist pattern formed in the step (3-g) is opposite from that in the step (2-g). The resist pattern in this step (3-g) needs to be formed to be thicker than the plating layer formed in the following step. The resist pattern 50 may be formed to be thicker than the plating layer 40 formed by 0.2 μm or more, usually in a range of 2 μm or more and 50 μm or less.

(Step (3-h))

In the step (3-h), the plating layer 40 is formed on a part of the electroconductive surface layer 30 where the resist pattern 50 is not formed. When the step (3-f) has been performed, the plating layer 40 is formed on the anti-oxidation layer 52. The method of forming the plating layer 40 may either electroplating or electroless plating. However, when the copper strike plating is formed as the anti-oxidation layer 52, it is efficient and preferable to employ electroplating since the copper strike is a kind of electroplating. The thickness of the plating layer is the same as in the step (2-f) described above. A material of the plating layer may be nickel, gold, silver, copper, etc.; however, copper is preferred. In performing copper plating, the examples given as the copper electroplating liquid in the step (2-f) may be employed. In addition, a copper plating layer may be formed first, and then a plating layer (for example, Ni/Au plating etc.) may be further formed thereon.

(Step (3-i))

In the step (3-i), the resist pattern 50 is removed. The method of removing the resist pattern 50 is the same as in the step (2-i) described above.

(Step (3-j))

In the step (3-j), the electroconductive surface layer 30 is etched. When the step (3-f) has been performed, the anti-oxidation layer 52 and the electroconductive surface layer 30 are etched.

In the step (3-*j*), the plating layer 40 is also partially etched; however, the etching rate of the electroconductive surface layer 30 is faster than that of the plating layer 40 formed by electroplating. Therefore, the electroconductive surface layer 30 can be preferentially etched before the plating layer 40 is etched.

Further, in the case of forming the anti-oxidation layer 52, it is possible to preferentially etch the part of the electroconductive surface layer 30 having the resist pattern formed by making the layer thickness of the anti-oxidation layer 52 sufficiently small compared with that of the plating layer 40 (for example by setting the layer thickness of the anti-oxidation 52 to be no more than one-twentieth of the thickness of the plating layer 40, and so on). Furthermore, with a combination of performing electroplating to form the plating layer 40 and performing electroless plating to form the anti-oxidation layer 52, the etching rate of the anti-oxidation layer 52 becomes faster than that of the plating layer 40, which is thus favorable.

On the other hand, when a copper plating layer is formed first and a plating layer of another metal (for example, Ni/Au plating etc.) is formed thereon, this plating layer of another metal protects the following layers that are present under this plating layer: the copper plating layer and the electroconductive surface layer 30; or the copper plating layer, the anti-oxidation layer 52, and the electroconductive surface layer 30. Therefore, the upper surface of these layers are not etched, enabling selective etching of the part of the electroconductive surface layer 30 and the anti-oxidation layer 52 where the resist pattern is formed.

An etching liquid and an etching method to be employed may be the same as in the step (2-*h*) described above; however, in view of enabling the etching rate to be slow and the amount of side etching of the plating layer 40 to be small, an ammonia type copper etching liquid containing tetraamminecopper(II) complex ion ($Cu(NH_3))_4^{2+}$), and a sulfuric acid-hydrogen peroxide type etching liquid are preferred.

(Step (3-*k*))

In the step (3-*k*), the active payer 29 formed in the interface between the electroconductive surface layer 30 and the sintered ceramic substrate 10 is etched. An etching liquid and an etching method to be employed are the same as in the step (2-*j*) described above.

Through the above steps, a metallized via-holed ceramic substrate 100*b* (in the case of not performing the step (3-*f*)) or a metallized via-holed ceramic substrate 100*c* (in the case of performing the step (3-*f*)) are manufactured.

<3. Metallized Via-Holed Ceramic Substrate 100 (100*a*, 100*b*, 100*c*)>

The metallized via-holed ceramic substrate 100 (100*a*, 100*b*, 100*c*) of the first aspect of the present invention manufactured by the method described above includes the sintered ceramic substrate 10, the electroconductive via 23, the active layers 29, the electroconductive surface layer 30, and the plating layer 40. In some cases, it may further comprise the copper plating layer formed first, and the plating layer of another metal (for example, Ni/Au plating etc.) thereon. Furthermore, when the metallized via-holed ceramic substrate 100 is manufactured by the method of the third aspect of the present invention, it preferably has the anti-oxidation layer 52 between the electroconductive surface layer 30 and the plating layer 40.

The electroconductive via 23 is dense with generation of voids inhibited, and thus has good conductivity. Further, the active layer 29 is formed in the interface between the via 23 and the sintered ceramic substrate 10, and the active layer 29 is formed in the interface between the electroconductive surface layer 30 and the sintered ceramic substrate 10; therefore, the adhesion between the via 23 and the sintered ceramic substrate 10 and the adhesion between the electroconductive surface layer 30 and the sintered ceramic substrate 10 are favorable. Additionally, the plating layer 40 having good conductivity is formed on the electroconductive surface layer 30 and improves the conductivity thereof.

In the metallized via-holed ceramic substrates 100 (100*a*, 100*b*, 100*c*) manufactured by the above methods, the thickness of the active layer formed in the interface between the via 23 and the sintered ceramic substrate 10 is 0.1 to 2 μm. Further, in the metallized via-holed ceramic substrates 100*a*, 100*b*, 100*c* manufactured by the above methods, the thickness of the active layer formed in the interface between the metal surface layer 30 and the sintered ceramic substrate 10 is 0.1 to 2 μm.

The resistivity of the via 23 measured by a four-probe method in the metallized via-holed ceramic substrate 100*a* and the metallized via-holed ceramic substrates 100*b* and 100*c* of the present invention can be set to be preferably $1.5 \times 10^{-7}$ Ω·m or less, and more preferably $1.0 \times 10^{-7}$ Ω·m or less.

The metallized via-holed ceramic substrates 100*a*, 100*b*, and 100*c* of the first aspect of the present invention have the electroconductive via 23 having an electroconductive metal closely filled in the through-hole, the electroconductive metal containing the metal (A) having a melting point of 600° C. to 1100° C., the metal (B) having a melting point higher than the melting point of the metal (A), and the active metal. This electroconductive via closely filled refers to a via in which the ratio of the area of voids is less than 5% based on the entire area of a cross section of the via as 100% in the observation of the cross section of the via by a scanning electron microscope at a magnification of 1000. In the present invention, it is also possible to form the electroconductive via in which the ratio of the area of voids is less than 1%. Obviously, the best configuration is that the ratio of the area of voids is 0% (no voids).

The metal layer ("active layer 29/electroconductive surface layer 30/plating layer 40" or "active layer 29/electroconductive surface layer 30/anti-oxidation layer 52/plating layer 40") formed on the sintered ceramic substrate 10 is patterned preferably by a photolithographic method. With the combination of forming the electroconductive via and forming the wiring pattern by firing the metal paste, the wiring can be made more precise compared with a method in which the metal paste is printed to form the wiring pattern. Furthermore, compared with the conventional method in which the metal is filled into the through-hole by plating, it is possible to make thin the plating layer (and the resist pattern in the case of the manufacturing method of the third aspect of the present invention). Therefore, the integration of the wiring can be enhanced compared with the conventional method. In the metallized via-holed ceramic substrate of the first aspect of the present invention, the line-and-space of the wiring pattern is preferably no more than 50 μm/50 μm, more preferably no more than 40 μm/40 μm, and still more preferably no more than 30 μm/30 μm.

EXAMPLES

Hereinafter, the present invention will be described in further detail with Examples and Comparative Examples. However, the present invention is not limited to these Examples.

Example 1

First Aspect and Second Aspect of the Present Invention (Preparation of First Metal Paste)

A mortar was used to pre-mix: 97 parts by mass of a mixture (mixing mass ratio 1:1) of a copper powder having an average particle diameter (D50) of 4.5 μm and a copper powder having an average particle diameter (D50) of 28 μm, as a powder of a metal (B); 3 parts by mass of a titanium hydride powder having an average particle diameter (D50) of 5 μm, as an active metal powder; and a vehicle obtained by dissolving 2 parts by mass of poly(alkyl methacrylate) in 4 parts by mass of terpineol. Thereafter a three-roll mill was used to disperse the resulting mixture. Thereby, a first metal paste was prepared.

(Preparation of Second Metal Paste)

Employed as a powder of a metal (B') were: 47 parts by mass of a copper powder having an average particle diameter (D50) of 0.3 μm; 24 parts by mass of a copper powder having an average particle diameter (D50) of 1 μm; and 14 parts by mass of a silver powder having an average particle diameter (D50) of 0.6 μm. A mortar was used to pre-mix the following into this powder of the metal (B'): 15 parts by mass of a pulverized titanium hydride powder having an average particle diameter (D50) of 2 μm, as an active metal powder; and a vehicle obtained by dissolving 0.5 parts by mass of poly(alkyl methacrylate) in a mixed solvent of 11 parts by mass of terpineol and 30 parts by mass of MTPH. Thereafter, a three-roll mill was used to disperse the resulting mixture. Thereby, a second metal paste was prepared.

(Preparation of Third Metal Paste)

A mortar was used to pre-mix: a powder of a Ag—Cu alloy solder having an average particle diameter (D50) of 6 μm (BAg-8: melting point 780° C., composition: silver 72 mass %-copper 28 mass %), as the powder of the metal (A); and a vehicle obtained by dissolving 4 parts by mass of poly(alkyl methacrylate) and 0.2 parts by mass of a phosphate-type dispersant in a mixed solvent of 13 parts by mass of terpineol and 6 parts by mass of diethylene glycol monobutyl ether acetate (BCA). Thereafter, a three-roll mill was used to disperse the resulting mixture. Thereby, a third metal paste was prepared.

(Manufacturing of Metallized Via-Holed Ceramic Substrate)

(Step (2-a), Step (2-b))

The first metal paste described above was filled into a 0.2 mm-diameter through-hole 12 of a 0.64 mm-thick sintered aluminum nitride substrate (sintered ceramic substrate 10) (manufactured by Tokuyama Corporation, product name SH-30) by screen printing using a metal mask, and was dried at 100° C. for 10 minutes. Then, both faces of the substrate were buffed to completely remove the first metal paste overflowing to the faces of the substrate, washed with water, and thereafter dried at 100° C. for 10 minutes.

(Step (2-c))

The second metal paste described above was printed over one face of the above substrate by screen printing, and dried at 150° C. for 10 minutes to form a second metal paste layer 24. However, the second metal paste layer was not formed in an area of 5 mm from the periphery of the substrate. The second metal paste layer 24 was formed on the back face of the substrate in the same manner.

(Step (2-d))

Subsequently, the third metal paste described above was printed on the second metal paste layer 24 by screen printing using a metal mask having a 0.4 mm-diameter through-hole, and dried at 100° C. for 10 minutes to form a third metal paste layer 27. At this time, the third metal paste layer 27 was formed substantially cylindrically so that the center of the circular printed pattern viewed in a direction perpendicular to the face of the substrate was positioned to almost overlap the center of each through-hole of the substrate. In addition, the amount of the third metal paste applied was adjusted such that the amount of the powder of the metal (A) contained in the third metal paste layer 24 was 80 parts by mass, based on 100 parts by mass of the powder of the metal (B) in the first metal paste 20 filled in the through-hole 12 ($A_3/B_1 \times 100$, where $A_3$ is the amount of the powder of the metal (A) contained in the third metal paste layer 24, and $B_1$ is the amount of the powder of the metal (B) contained in the first metal paste layer filled in the through-hole 12).

(Step (2-e))

Then, the substrate 10 was fired under vacuum at 900° C. for 30 minutes, to thereby form an electroconductive via 23 in the through-hole 12 and an electroconductive surface layer 30 on the substrate 10. At this time, the substrate was fired in a state of being accommodated in a setter made of aluminum nitride (in a closed container). In accommodating the substrate in the setter, the substrate was placed in a manner that the second metal paste layer 24 did not contact with the setter and only the area of the substrate periphery not having the second metal paste layer 24 formed was contacted to the setter. At this time, the printed layer thickness of the metal paste composition was adjusted so that the thickness of the electroconductive surface layer 30 was 2 μm. Next, the surface of the electroconductive surface layer 30 was buffed to be smooth until the thickness of thereof became 1.5 μm. When seeing a cross section of the substrate formed in the same conditions with an electron microscope, the thickness of the titanium nitride layer (active layer) 29 was 0.5 μm.

(Step (2-f))

Thereafter, a copper sulfate plating bath was used to perform electroplating at a current density of 3.0 A/dm$^2$, to form a 3 μm-thick copper plating layer 40 on the electroconductive surface layers 30 on both faces of the substrate.

(Step (2-g))

Subsequently, a dry film resist in a thickness of 19 μm was adhered onto the copper plating layer 40 on both faces of the substrate, and was exposed to an ultrahigh pressure mercury lamp through a photomask having a wiring pattern formed. Then, the dry film resist was developed using an aqueous sodium carbonate solution, thereby forming a resist pattern on the copper plating layer 40. At this time, the photomask used had a stripe pattern with a pitch of 60 μm (line/space=30/30 μm) for evaluation of the pattern lithography performance and a 2-mm square pattern for evaluation of the bonding strength. A part of the 2-mm square pattern was formed such that the electroconductive via 23 was included in the square patterns on both faces of the substrate when viewed in the direction perpendicular to the face of the substrate in order to allow electrical conduction between the patterns on both faces of the substrate through the electroconductive via 23.

(Step (2-h))

Next, a ferric chloride liquid (Baume degree 45° Be) was used to perform spray etching at a liquid temperature of 20° C. and a spray pressure of 0.15 MPa. The time at which all of the exposed parts of the copper plating layer 40 and the electroconductive surface layer 30 not having the dry film resist were etched was defined as a just-etching time; and an etching time was set as the just-etching time plus five seconds. The substrate after the etching process was subjected to ultrasonic cleaning in water, to remove a black residue partially deposited on the substrate after the etching process. In the substrate after the etching process, the part of the copper plating layer 40 and the electroconductive surface layer 30 not covered with the resist was removed, and the titanium nitride layer 29 in a golden color was exposed.

(Step (2-*i*))

Then, the substrate was immersed in a 3% sodium hydroxide solution, to remove the resist.

(Step (2-*j*))

Subsequently, 8 g of ethylenediaminetetraacetic acid (EDTA) was added to 480 g of 30% hydrogen peroxide solution; and 25% ammonia water was further added thereto, to neutralize and dissolve EDTA and to prepare a titanium nitride etching liquid (pH 7.5). The substrate was immersed in the titanium nitride etching liquid; and the titanium nitride layer 29 exposed on the face of the substrate and the partially remaining residue of the electroconductive surface layer 30 were removed by being etched. Thereby, a metallized substrate 100*a* was obtained. Then, evaluation of the metallized substrate 100*a* obtained was performed, the results of which are shown in Table 1.

Example 2

First Aspect and Second Aspect of the Present Invention

Filling of a metal paste into the 0.2 mm-diameter through-hole 12 of the 0.64 mm-thick sintered aluminum nitride substrate 10, and printing and drying of a metal paste on the substrate were performed in the same manner as in Example 1 (steps (3-*a*) to (3-*d*) carried out in the same way as the steps (2-*a*) to (2-*d*)). Then, the substrate was fired and buffed in the same manner as in Example 1, to thereby form an electroconductive surface layer 30 (step (3-*e*) carried out in the same way as the step (2-*e*)).

(Step (3-*f*))

Subsequently, an electroless copper plating bath using formalin as a reducing agent was used to form an anti-oxidation layer 52 made of an electroless plating layer having a thickness of 0.1 μm.

(Step (3-*g*))

Then, a dry film resist in a thickness of 19 μm was adhered onto a predetermined part and was exposed to an ultrahigh pressure mercury lamp through a photomask having a wiring pattern formed. Thereafter, the dry film resist was developed using an aqueous sodium carbonate solution, to form a resist pattern on the anti-oxidation layer 52. At this time, the photomask used had a stripe pattern with a pitch of 60 μm (line/space=30/30 μm) for evaluation of the pattern lithography performance and a 2-mm square pattern for evaluation of the bonding strength. A part of the 2-mm square pattern was formed such that the electroconductive via 23 was included in the square patterns on both faces of the substrate when viewed in the direction perpendicular to the front face of the substrate in order to allow electrical conduction between the patterns on both faces of the substrate through the electroconductive via 23.

(Step (3-*h*))

Then, a copper sulfate plating bath was used to perform electroplating at a current density of 3 A/dm$^2$, to form a 10 μm-thick copper plating layer on the part of the anti-oxidation layer 52 where the resist layer was not formed. Further, a 3 μm-thick nickel layer and a 0.2 μm-thick gold plating layer were formed on the copper plating layer by electroplating, to thereby form a plating layer 40 having the copper plating layer, the nickel plating layer, and the gold plating layer.

(Step (3-*i*))

Then, the substrate was immersed in a 3% sodium hydroxide solution, to remove the resist.

(Step (3-*j*))

Next, the substrate was immersed in an ammonia type copper etching liquid containing tetraamminecopper(II) complex ion $(Cu(NH_3))_4^{2+}$), to dissolve and remove the exposed face of the anti-oxidation layer 52 and the electroconductive surface layer 30. Thereafter, the substrate after the etching process was subjected to ultrasonic cleaning in water, to remove a black residue partially deposited on the substrate after the etching process. In the substrate after the etching process, the part of the anti-oxidation layer 52 and the electroconductive surface layer 30 not covered with the copper plating layer was removed, and the titanium nitride layer 29 in a golden color was exposed.

(Step (3-*k*))

Subsequently, the titanium nitride layer 29 exposed on the face of the substrate and the partially remaining residue of the electroconductive surface layer 30 were removed, in the same manner as in the step (2-*j*) of Example 1. Thereby, a metallized substrate 100*c* was obtained, and evaluation thereof was performed in the same way as in Example 1. However, when evaluating the bonding strength, the electroless nickel plating and the electroless gold plating were not formed on the metallized pattern. The results are shown in Table 1.

Example 3

First Aspect and Third Aspect of the Present Invention

A metallized substrate 100*b* was obtained in the same way as in Example 2, except that the step (3-*f*) was not performed (that is, the anti-oxidation layer 52 was not formed) in Example 2. Evaluation of the metallized substrate 100*b* obtained was performed in the same way as in Example 1. However, when evaluating the bonding strength, the electroless nickel plating and the electroless gold plating were not formed on the metallized pattern. The results are shown in Table 1.

Examples 4 and 5

First Aspect and Second Aspect of the Present Invention

A metallized substrate was made in the same way as in Example 1, except that the thickness of the metal mask used was adjusted in the step (2-*d*) in Example 1 and that thereby the amount of the third metal paste layer 27 applied was adjusted such that the amount of the powder of the metal (A) contained in the third metal paste layer 27 was as shown in Table 1, based on 100 parts by mass of the powder of the metal (B) in the first metal paste 20 filled in the through-hole 12 ($A_3/B_1 \times 100$ parts by mass). Evaluation of the obtained metallized substrate was performed in the same way as in Example 1. The results are shown in Table 1.

Comparative Example 1

A 0.3 μm-thick seed layer made of titanium and a 0.4 μm-thick copper layer (copper sputter layer) were formed, in the mentioned order, on both faces of a 0.64 mm-thick sintered aluminum nitride substrate (sintered ceramic substrate 10) having a 0.2 mm-diameter through-hole 12 (manufactured by Tokuyama Corporation, product name SH-30) by using an argon plasma sputtering apparatus.

Subsequently, an electroless copper plating bath using formalin as a reducing agent was used to form a 0.4 μm-thick electroless plating layer on the copper sputter layer and in the through-hole.

Then, a copper sulfate plating bath was used to perform electroplating at a current density of 3.0 A/dm$^2$, to form a copper plating layer on the electroless plating layer. When the electroplating was performed until an electroconductive via having the copper plating layer filled into the through-hole was formed, the layer thickness of the copper plating layer on the electroconductive surface layer was 120 μm.

Thereafter, the steps (2-g) through (2-j) were carried out in the same manner as in Example 1; and thereby a metallized substrate was obtained. The metallized substrate obtained was evaluated in the same way as in Example 1. However, in etching the copper plating layer, the resist pattern formed in a pitch of 60 μm dropped off. Thus, a stripe pattern of the copper plating layer could not be formed, and evaluation of the pattern lithography performance could not be performed. Further, in evaluation of the densification of the electroconductive via, a large void was observed inside the electroconductive via. The results are shown in Table 1.

<Evaluation Methods>

The performances of metallized via-holed ceramic substrates obtained in the Examples and the Comparative Example described above were evaluated in the following way.

(Evaluation of Densification of Electroconductive Via)

The metallized via-holed ceramic substrates obtained in the above Examples and Comparative Example were embedded in an epoxy resin and mirror-polished by wet buffing, to prepare samples for observing the cross sections of the metallized via-holed ceramic substrates. The obtained observation samples were observed using a scanning electron microscope (S-3400N manufactured by Hitachi High Technologies. Co., Ltd.) (acceleration voltage of 15 kV; secondary electron detection mode; observation magnification of 1000), to evaluate the amount of voids in the electroconductive via. When the ratio of the area of voids to the entire area of the cross section of the electroconductive via was less than 1%, it was evaluated as excellent; when the ratio was 1% or more and less than 5%, it was evaluated as good; and when the ratio was 5% or more, it was evaluated as poor. The results are shown in Table 1.

(Evaluation of Pattern Lithography Performance)

The metallized via-holed ceramic substrates obtained in the above Examples and Comparative Example were evaluated in terms of the reproducibility of the stripe-shaped photomask having a pitch of 60 μm (line/space=30/30 μm). The stripe-shaped metallized pattern formed on the face of the metallized via-holed ceramic substrate was observed using a laser microscope; and the line width of the upper portion of the metallized layer was measured. Further, occurrence of breaking of the line was checked. The results are shown in Table 1.

(Active Layer: Checking Presence of Titanium Nitride Layer)

The samples for observing the cross sections of the metallized via-holed ceramic substrates obtained above were observed using the above scanning electron microscope (acceleration voltage of 15 kV; backscattered electron detection mode; observation magnification of 2000); and the thickness of the titanium nitride layer (TiN layer) in the interface between the sintered ceramic substrate and the electroconductive via, and the thickness of the titanium nitride layer (TiN layer) in the interface between the sintered ceramic substrate and the metallized layer were judged. The results are shown in Table 1.

(Evaluation of Bonding Strength)

About 2.5 μm-thick electroless nickel plating was given over the metallized patterns of the evaluation metallized via-holed ceramic substrates obtained in the above Examples and Comparative Example; then, about 0.4 μm-thick electroless gold plating was given thereon. Thereafter, the bonding strength was evaluated in the following procedure. A 42 alloy nail headpin having a tip diameter of 1.1 mm and having its tip surface nickel-plated was soldered, by a Pb—Sn solder, on each of the 2 mm-square plated metallized patterns in a manner perpendicular to the substrate; and the nail headpin was pulled in the perpendicular direction at a speed of 10 mm/min. The load exhibited when it broke off the substrate was recorded. The same test was performed five times to calculate an average value of the load. The results are shown in Table 1.

TABLE 1

| | | Layer | | Thickness (μm) of TiN Layer | | Pattern Lithograpy Performance | | |
| --- | --- | --- | --- | --- | --- | --- | --- | --- |
| | $A_3/B_1 \times 100$ | Thickness (μm) of Copper plating Layer | Densification of Electroconductive Via | Between Substrate and Electroconductive Via | Between Substrate and Electroconductive Surface Layer | Line Width (μm) of Upper Portion of Metallized Layer | Breaking of Line | Bonding Strength (kgf) |
| Example 1 | 80 | 3 | Excellent | 0.5 | 1.2 | 20 | No | 11 |
| Example 2 | 80 | 10 | Excellent | 0.5 | 1.2 | 30 | No | 11 |
| Example 3 | 80 | 10 | Excellent | 0.5 | 1.2 | 29 | No | 11 |
| Example 4 | 20 | 3 | Good | 0.5 | 1.1 | 20 | No | 11 |
| Example 5 | 50 | 3 | Excellent | 0.5 | 1.2 | 20 | No | 11 |
| Comparative Example 1 | | 120 | Poor | | | | | 11 |

<Evaluation Results>

In Comparative Example 1, since the electroconductive via was formed by plating at the time of forming the copper plating layer, electroplating needed to be performed until the through-hole was filled with copper, thus resulting in large layer thickness of the copper plating layer. In consequence, the amount of the side etching increased in etching the copper plating layer, therefore causing the resist to be peeled off during the etching process and preventing formation of the stripe pattern with a pitch of 60 μm. Further, a large void was formed in the electroconductive via.

By contrast, in Example 1, the electroconductive via had already been formed when the copper plating layer was formed and the through-hole did not need to be filled by plating, therefore enabling reduction of the layer thickness of the copper plating layer. As a result, it was possible to form the stripe pattern with a pitch of 60 μm. The same applied in Examples 2 to 5 as well.

The present invention has been described above as to the embodiment which is supposed to be practical as well as preferable at present. However, it should be understood that the present invention is not limited to the embodiment disclosed in the specification of the present application and can be appropriately modified within the range that does not depart from the gist or spirit of the invention, which can be read from the appended claims and the overall specification, and that a metallized via-holed ceramic substrate and a method for manufacturing the metallized via-holed ceramic substrate with such modifications are also encompassed within the technical range of the present invention.

INDUSTRIAL APPLICABILITY

The metallized via-holed ceramic substrate of the present invention can be used for mounting an electron device such as an LED. Particularly, when the sintered substrate is formed of AlN, it can be favorably used as a substrate for mounting an electron device which releases a large amount of heat, such as a high-output LED. The metallized via-holed ceramic substrate of the present invention can be manufactured by the manufacturing method of the present invention.

DESCRIPTION OF THE REFERENCE NUMERALS 10 sintered ceramic substrate
12 through-hole
20 first metal paste
23 electroconductive via
24 second metal paste layer
27, 27X, 27Y third metal paste layer
29 active layer
30 electroconductive surface layer
40 plating layer
50 resist pattern
52 anti-oxidation layer
100a, 100b, 100c metallized via-holed ceramic substrate

The invention claimed is:

1. A metallized via-holed ceramic substrate comprising: a sintered ceramic substrate; an electroconductive via formed in the sintered ceramic substrate, said electroconductive via having an electroconductive metal closely filled in a through-hole of the sintered ceramic substrate, said electroconductive metal containing a metal (A) having a melting point of 600° C. to 1100° C., a metal (B) having a melting point higher than the melting point of the metal (A), and an active metal; a wiring pattern on at least one face of the sintered ceramic substrate, said wiring pattern having an electroconductive surface layer and a plating layer on a surface of the electroconductive surface layer, said electroconductive surface layer consisting of an electroconductive metal containing the metal (A), the metal (B), and the active metal; an active layer formed in an interface between the electroconductive via and the sintered ceramic substrate; and an active layer formed in an interface between the electroconductive surface layer and the sintered ceramic substrate, wherein said metal (A) having a melting point of 600° C. to 1100° C. is one or more selected from a group consisting of gold solder, silver solder, and copper; and said metal (B) having a melting point higher than the melting point of the metal (A) is one or more selected from a group consisting of silver, copper, and gold.

2. The metallized via-holed ceramic substrate according to claim 1, wherein each said active layer is a reaction layer formed via a reaction of each said active metal with a ceramic component of the sintered ceramic substrate.

3. The metallized via-holed ceramic substrate according to claim 2, wherein
said active metals are titanium;
said ceramic component to react with the titanium is nitrogen; and
said reaction layers are titanium nitride layers.

4. The metallized via-holed ceramic substrate according to claim 1, wherein said sintered ceramic substrate is a sintered aluminum nitride substrate.

5. The metallized via-holed ceramic substrate according to claim 1, wherein said plating layer comprises a copper plating layer.

6. The metallized via-holed ceramic substrate according to claim 1, wherein said wiring pattern is a metallized pattern formed by a photolithographic method.

7. The metallized via-holed ceramic substrate according to claim 1, wherein a line-and-space of said wiring pattern is no more than 50 μm/50 μm.

8. A method for manufacturing the metallized via-holed ceramic substrate as in claim 1, the method comprising the steps of:
(i) preparing a sintered ceramic substrate having a through-hole;
(ii) filling a first metal paste into the through-hole, wherein said first metal paste contains a powder of a metal (B) having a melting point higher than a melting point of a metal (A), and an active metal powder;
(iii) applying a second metal paste on at least one face of the sintered ceramic substrate, thereby forming a second metal paste layer where the second metal paste contacts with the first metal paste filled in the through-hole, wherein said second metal paste contains a powder of a metal (B') having a melting point higher than the melting point of the metal (A) and an active metal powder;
(iv) applying a third metal paste on the second metal paste layer, thereby forming a third metal paste layer, wherein said third metal paste contains a powder of the metal (A) having a melting point of 600° C. to 1100° C., and wherein an area where said third metal paste layer is formed overlaps with an area occupied by an opening of the through-hole in contact with the second metal paste layer in contact with formed said third metal paste layer in a penetrative plan view of the sintered ceramic substrate;
(v) firing the substrate obtained via the preceding steps (i) to (iv), thereby forming an electroconductive via in the through-hole, an electroconductive surface layer on the sintered ceramic substrate, an active layer in an interface between the electroconductive via and the sintered ceramic substrate, and an active layer in an interface between the electroconductive surface layer and the sintered ceramic substrate;
(vi) forming a plating layer on the electroconductive surface layer;
(vii) forming a resist pattern on a part of the plating layer to be left as a wiring pattern;

(viii) removing a part of the plating layer and the electroconductive surface layer not covered by the resist pattern, by an etching process;

(ix) removing the resist pattern; and (x) etching an exposed part of the active layer formed in the interface between the electroconductive surface layer and the sintered ceramic substrate, wherein said metal (A) having a melting point of 600° C. to 1100° C. is one or more selected from a group consisting of gold solder, silver solder, and copper; and said metal (B) having a melting point higher than the melting point of the metal (A) is one or more selected from a group consisting of silver, copper, and gold.

9. A method for manufacturing the metallized via-holed ceramic substrate as in claim 1, the method comprising the steps of:

(i) preparing a sintered ceramic substrate having a through-hole;

(ii) filling a first metal paste into the through-hole, said first metal paste containing a powder of a metal (B) having a melting point higher than a melting point of a metal (A), and an active metal powder;

(iii) applying a second metal paste on at least one face of the sintered ceramic substrate, thereby forming a second metal paste layer where the second metal paste contacts with the first metal paste filled in the through-hole, wherein said second metal paste contains a powder of a metal (B') having a melting point higher than the melting point of the metal (A) and an active metal powder;

(iv) applying a third metal paste on the second metal paste layer, thereby forming a third metal paste layer, wherein said third metal paste contains a powder of the metal (A) having a melting point of 600° C. to 1100° C., and wherein an area where said third metal paste layer is formed overlaps with an area occupied by an opening of the through-hole in contact with the second metal paste layer in contact with formed said third metal paste layer in a penetrative plan view of the sintered ceramic substrate;

(v) firing the substrate obtained via the preceding steps (i) to (iv), thereby forming an electroconductive via in the through-hole, an electroconductive surface layer on the sintered ceramic substrate, an active layer in an interface between the electroconductive via and the sintered ceramic substrate, and an active layer in an interface between the electroconductive surface layer and the sintered ceramic substrate;

(vi) forming a resist pattern on a part of the electroconductive surface layer where a wiring pattern is not to be formed;

(vii) forming a plating layer on a part of the electroconductive surface layer not covered by the resist pattern;

(viii) removing the resist pattern;

(ix) etching an exposed part of the electroconductive surface layer; and (x) etching an exposed part of the active layer formed in the interface between the electroconductive surface layer and the sintered ceramic substrate, wherein said metal (A) having a melting point of 600° C. to 1100° C. is one or more selected from a group consisting of gold solder, silver solder, and copper; and said metal (B) having a melting point higher than the melting point of the metal (A) is one or more selected from a group consisting of silver, copper, and gold.

10. The method for manufacturing the metallized via-holed ceramic substrate according to claim 9, further comprising the step of:

(v') forming an anti-oxidation layer on the electroconductive surface layer by copper strike, after the step (v).

11. The method for manufacturing the metallized via-holed ceramic substrate according to claim 8, further comprising the step of:

(v") polishing a surface of the electroconductive surface layer, after the step (v).

12. The method for manufacturing the metallized via-holed ceramic substrate according to claim 8, wherein the powder of the metal (B') contains an elemental metal powder of a metal element which is contained in the powder of the metal (A) and has a higher melting point than the melting point of the metal (A).

13. The method for manufacturing the metallized via-holed ceramic substrate according to claim 12, wherein the powder of the metal (A) contains a powder of a silver-copper alloy solder;

the powder of the metal (B) contains a copper powder;

the powder of the metal (B') contains a copper powder and a silver powder; and each said active metal powder is one or more selected from a group consisting of a titanium powder and a titanium hydride powder.

14. The method for manufacturing the metallized via-holed ceramic substrate according to claim 9, further comprising the step of:

(v") polishing a surface of the electroconductive surface layer, after the step (v).

15. The method for manufacturing the metallized via-holed ceramic substrate according to claim 9, wherein the powder of the metal (B') contains an elemental metal powder of a metal element which is contained in the powder of the metal (A) and has a higher melting point than the melting point of the metal (A).

16. The method for manufacturing the metallized via-holed ceramic substrate according to claim 15, wherein the powder of the metal (A) contains a powder of a silver-copper alloy solder;

the powder of the metal (B) contains a copper powder;

the powder of the metal (B') contains a copper powder and a silver powder; and each said active metal powder is one or more selected from a group consisting of a titanium powder and a titanium hydride powder.

* * * * *